United States Patent
Nakai

(10) Patent No.: US 7,106,129 B2
(45) Date of Patent: Sep. 12, 2006

(54) SEMICONDUCTOR DEVICE LESS SUSCEPTIBLE TO VARIATION IN THRESHOLD VOLTAGE

(75) Inventor: Hiroaki Nakai, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 108 days.

(21) Appl. No.: 10/883,807

(22) Filed: Jul. 6, 2004

(65) Prior Publication Data

US 2004/0238875 A1    Dec. 2, 2004

Related U.S. Application Data

(62) Division of application No. 10/222,998, filed on Aug. 19, 2002, now Pat. No. 6,771,117.

(30) Foreign Application Priority Data

Feb. 26, 2002    (JP) ............................. 2002-049685

(51) Int. Cl.
G05F 1/10    (2006.01)
(52) U.S. Cl. ..................................... 327/541; 327/540
(58) Field of Classification Search ................ 327/540, 327/541; 323/316
See application file for complete search history.

(56) References Cited

U.S. PATENT DOCUMENTS

| | | | | |
|---|---|---|---|---|
| 4,636,664 A * | 1/1987 | Craycraft et al. | ............... | 327/52 |
| 4,885,477 A * | 12/1989 | Bird et al. | ..................... | 327/52 |
| 4,926,442 A | 5/1990 | Bukowski et al. | ........... | 375/317 |
| 5,173,616 A * | 12/1992 | Hinooka | ..................... | 327/525 |
| 5,335,203 A | 8/1994 | Ishii et al. | ..................... | 365/226 |
| 5,448,200 A | 9/1995 | Fernandez et al. | ........... | 327/560 |
| 5,701,136 A | 12/1997 | Huq et al. | ................... | 345/100 |
| 5,739,712 A | 4/1998 | Fujii | ........................... | 327/323 |
| 5,898,323 A * | 4/1999 | Suda | ........................... | 327/66 |
| 5,920,205 A * | 7/1999 | Bushehri et al. | ............ | 326/115 |
| 6,034,519 A | 3/2000 | Yang | ........................... | 323/316 |
| 6,078,210 A | 6/2000 | Uchida et al. | ............... | 327/530 |
| 6,087,821 A * | 7/2000 | Kojima | ........................ | 323/315 |
| 6,097,242 A | 8/2000 | Forbes et al. | ................ | 327/537 |
| 6,236,243 B1* | 5/2001 | Takeshima | .................... | 327/88 |
| 6,320,429 B1* | 11/2001 | Yano | ........................... | 327/89 |
| 6,445,216 B1* | 9/2002 | Bruneau et al. | .............. | 327/52 |
| 6,501,299 B1* | 12/2002 | Kim et al. | ..................... | 326/83 |
| 6,529,421 B1 | 3/2003 | Marr et al. | ............ | 365/189.09 |
| 6,630,859 B1* | 10/2003 | Wang | ........................... | 327/539 |
| 6,661,713 B1* | 12/2003 | Kuo | ........................ | 365/189.09 |
| 6,750,684 B1* | 6/2004 | Lim | ........................... | 327/108 |
| 6,844,711 B1* | 1/2005 | Sutardja et al. | .............. | 323/314 |
| 6,894,555 B1* | 5/2005 | Liu | ................................ | 327/539 |
| 6,937,001 B1* | 8/2005 | Ueda | ........................... | 323/313 |

OTHER PUBLICATIONS

"VLSI Memory Chip Design", Kiyoo Itoh, 2001, pp. 296-301.
"Analog Integrated Circuit Design Technology for VLSI", vol. 2, P. R. Gray and R. G. Meyer, Dec. 1990, pp. 304-311.

(Continued)

Primary Examiner—Terry D. Cunningham
(74) Attorney, Agent, or Firm—McDermott Will & Emery LLP

(57) ABSTRACT

A threshold compensating circuit generates a bias potential VBIAS, that is, a threshold voltage of a MOS transistor offset by a given value. A gate-source voltage having compensation for variation in threshold voltage is thus applied to a transistor. By using a differential amplifier having this transistor as a current source, a voltage down-converter less susceptible to variation in threshold voltage caused by process variation and temperature can be implemented.

4 Claims, 22 Drawing Sheets

OTHER PUBLICATIONS

"A CMOS Bandgap Reference Circuit with Sub-1-V Operation", Hironori Banba et al., 1999, IEEE, Journal of Solid-State Circuits, vol. 34, No. 5, May 1999, pp. 670-673.

"A Precise On-Chip Voltage Generator for a Gigascale DRAM with a Negative World-Line Scheme", Hitoshi Tanaka et al., 1999, IEEE Journal of Solid-State Circuits, vol 34, No. 8, Aug. 1999, pp. 1084-1089.

A New On-Chip Voltage Converter for Submicrometer High-Density DRAM's, Tohru Furuyama, et al., IEEE Journal of Solid-State Circuits, vol. sc-22, No. 3, Jun. 1987, pp. 437-440.

* cited by examiner

FIG.10

| CPR2 | CPR1 | CPR0 | VBC2 | VBC1 | VBC0 | ROU | ROL | FAIL |
|---|---|---|---|---|---|---|---|---|
| 0 | 0 | 0 | 0 | 0 | 1 | 1 | 0 | 0 |
| 0 | 0 | 1 | 0 | 0 | 1 | 0 | 0 | 0 |
| 0 | 1 | 0 | x | x | x | x | x | 1 |
| 0 | 1 | 1 | x | x | x | x | x | 1 |
| 1 | 0 | 0 | 1 | 0 | 0 | 0 | 0 | 0 |
| 1 | 0 | 1 | x | x | x | x | x | 1 |
| 1 | 1 | 0 | 0 | 1 | 0 | 0 | 0 | 0 |
| 1 | 1 | 1 | 1 | 0 | 0 | 0 | 1 | 0 |

| COUNT1R | COUNT0R | CPR | VBC0 | VBC1 | VBC2 | RO |
|---|---|---|---|---|---|---|
| 0 | 0 | 0 | 0 | 0 | 0 | 0 |
| 0 | 0 | 1 | 0 | 0 | 0 | 0 |
| 0 | 1 | 0 | 0 | 0 | 1 | 0 |
| 0 | 1 | 1 | 0 | 0 | 1 | 0 |
| 1 | 0 | 0 | 0 | 1 | 0 | 0 |
| 1 | 0 | 1 | 0 | 1 | 0 | 0 |
| 1 | 1 | 0 | 1 | 0 | 0 | 1 |
| 1 | 1 | 1 | 1 | 0 | 0 | 0 |

SEMICONDUCTOR DEVICE LESS SUSCEPTIBLE TO VARIATION IN THRESHOLD VOLTAGE

CROSS REFERENCE TO RELATED APPLICATIONS

This application is a Divisional of prior U.S. application Ser. No. 10/222,998, filed 19 Aug. 2002, now U.S. Pat. No. 6,771,117

BACKGROUND OF THE INVENTION

1. Field of the Invention

The present invention generally relates to a semiconductor device. More particularly, the present invention relates to a semiconductor device having a voltage down-converter.

2. Description of the Background Art

Recently, transistors for use in semiconductor devices are increasingly miniaturized in order to implement reduced costs, reduced power consumption and increased operation speed. A power supply potential must be reduced in order to ensure reliability of the miniaturized transistors.

A semiconductor device is a fundamental component that is used together with various components in various equipments. However, reduction in voltage has not been implemented for most other components that are used in equipments including a semiconductor device. In view of matching between a semiconductor device and other components, a semiconductor device using a miniaturized transistor must operate with an external power supply potential that is high enough to degrade reliability if it is directly applied to the transistor.

Therefore, a voltage down-converter is required. The voltage down-converter is mounted within the semiconductor device, and serves to down-convert a high external power supply potential to the level acceptable to the miniaturized transistor in terms of reliability.

FIG. 23 is a circuit diagram showing the structure of a conventional voltage down-converter 524.

Referring to FIG. 23, voltage down-converter 524 includes a reference potential generator 534 for outputting reference potentials VREF, VBGR, and a down-converting portion 536 for receiving reference potentials VREF, VBGR, down-converting an external power supply potential EXTVDD and outputting an internal power supply potential INTVDD. Internal power supply potential INTVDD is supplied to a load circuit 526. Reference potential generator 534 and down-converting portion 536 have the same structure as that of a reference potential generator 34E and a down-converting portion 36 described later. Therefore, description thereof will not be given herein. In the figure, a resistor R2A has the same resistance value as that of a resistor R2.

Down-converting portion 536 is a circuit for receiving an external power supply potential EXTVDD and generating a lower internal power supply potential INTVDD based on a reference potential VREF generated by reference potential generator 534. Internal power supply potential INTVDD is given by the following expression (1):

$$INTVDD = \frac{R5 + R6}{R5} * VREF. \tag{1}$$

Accordingly, internal power supply potential INTVDD varies with variation in reference potential VREF. In order to prevent this, a semiconductor device is designed so that reference potential VREF is less susceptible to the internal power supply potential, process variation, and temperature variation.

FIG. 23 shows a bandgap-type reference potential generator 534. A bandgap-type reference potential generator is also called a "bandgap voltage reference", and is commonly used as a reference potential generator causing less variation in reference potential VREF.

Hereinafter, a voltage generated by the bandgap-type reference potential generator will be described. In general, a current flowing through a diode is given by the following expression (2), where Is is a saturation current, q is the amount of charges of electron, k is a Boltzmann's constant, T is an absolute temperature and Vbe is a base-emitter voltage:

$$I = Is\left(e^{\frac{qVbe}{kT}} - 1\right) \tag{2}$$

$$\simeq Is * e^{\frac{qVbe}{kT}} \left( \because Vbe \gg \frac{kT}{q} \right).$$

From the expression (2), $Vbe = \frac{kT}{q} * \ln\frac{I}{Is}.$ \quad (3)

Accordingly, in Fig. 23, \quad (4)

$$Vbe1 - Vbe2 = \frac{kT}{q}\left(\ln\frac{I1}{Is} - \ln\frac{I2}{Is}\right)$$

$$= \frac{kT}{q} * \ln\left(n * \frac{I1}{I2}\right).$$

Provided that $V(W12) = V(W13)$, $I1 = I2$. Therefore, \quad (5)

$$Vbe1 - Vbe2 = \frac{kT}{q} * \ln(n).$$

Moreover, since $Vbe2 = VBGR - (R1 + R2)I2$ and $Vbel = VBGR - R2I1,$ $$R2I1 + (R1 + R2)I2 = \frac{kT}{q}\ln(n)$$

$$R1R2 = \frac{kT}{q}\ln(n), I1 = I2 = \frac{\frac{kT}{q}\ln(n)}{R1}. \tag{6}$$

From the expression (6), $$VBGR = R2I1 + Vbe1 \tag{7}$$

$$= Vbe1 + \frac{R2}{R1} * \frac{kT}{q} * \ln(n).$$

Therefore, $$VREF = \frac{R3}{R3 + R4}VBGR \tag{8}$$

$$= \frac{R3}{R3 + R4}\left(Vbe1 + \frac{R2}{R2} \cdot \frac{kT}{q} \cdot \ln(n)\right).$$

Note that the expression (5) is obtained on the assumption that V(W12)=V(W13). The reason for this is as follows: since transistors P1, P2 of the same size are used, the same current flows through transistors P1, P2. In this case, by using transistors N1, N2 of the same size, a differential amplifier 38E controls the gate of a transistor P6 so that V(W12)=V(W13).

Potentials VBGR, VREF generated by reference potential generator 534 in FIG. 23 are thus given by the above expressions (7), (8), respectively.

Reference potential VREF is adjusted by adjusting the resistance value of resistors R3, R4. The level of internal power supply potential INTVDD is thus adjusted.

Resistors R1, R2 are formed from the same material so as to have the same variation in characteristics and the same temperature dependency. Similarly, resistors R3, R4 are formed from the same material so as to have the same variation in characteristics and the same temperature dependency. Similarly, resistors R5, R6 are formed from the same material so as to have the same variation in characteristics and the same temperature dependency. In the figure, resistors R2, R2A have the same resistance value and are formed from the same material.

It is known that process variation is a factor that cannot be ignored for a threshold voltage Vth of a MOS (Metal Oxide Semiconductor) transistor. In contrast, as described in "Analog Integrated Circuit Design Technology for VLSI", Vol. 2, P. R. Gray, R. G. Meyer, Baifukan Co., Ltd, p. 310, Vbe is approximately unique to a material such as silicon and has little variation. However, Vbe has temperature dependency of about −2 mV/° C. Accordingly, ∂VBGR/∂T=0 is achieved by determining the resistance value of resistors R1, R2 so as to satisfy the following expression (9):

$$\frac{R2}{R1} = -\frac{\partial Vbe}{\partial T} * \frac{q}{k} \div \ln(n). \qquad (9)$$

As a result, potential VBGR generated by bandgap-type reference potential generator 534 is less susceptible to power supply voltage, process variation and temperature.

Accordingly, reference potential VREF is also less susceptible to power supply voltage, process variation and temperature.

Thus, internal power'supply potential INTVDD can be generated without being significantly affected by power supply voltage, process variation and temperature.

Recently, reduction in power consumption is increasingly required for the semiconductor devices, and therefore reduction in current consumption in the standby period is a prime task in the industry. In the semiconductor devices such as static random access memory (SRAM) and dynamic random access memory (DRAM), the value of a semiconductor device is determined mainly based on how fast the semiconductor device can start operation such as read and write operations after it transitions from standby to active state.

However, the voltage down-converter must drive a huge load circuit. Therefore, quick start operation cannot be implemented if the voltage down-converter is not operated until the semiconductor device transitions to the active state (i.e., if the voltage down-converter is stopped while the semiconductor device is in the standby state for the purpose of power saving).

Accordingly, the voltage down-converter must be operated from the standby state of the semiconductor device. Current consumption of the voltage down-converter thus accounts for a large percentage of a standby current of the semiconductor device. It is a bias current Ibias flowing through the differential amplifier that accounts for a large percentage of current consumption of the voltage down-converter. The circuit is therefore designed so as to minimize bias current Ibias.

However, as described in "VLSI Memory Chip Design", Kiyoo Ito, Springer-Verlag Telos, 2001. 4, pp. 297–298, reducing bias current Ibias degrades responsiveness of the differential amplifier, thereby causing increase in voltage drop.

FIG. 24 illustrates a problematic voltage drop caused by a reduced bias current.

Referring to FIG. 24, the semiconductor device transitions from standby to active state at time t1. If bias current Ibias is reduced, responsiveness of the differential amplifier is degraded, whereby the potential on a node W17 drops with time delay. This increases the drop Vdrop of internal power supply potential INTVDD right after transition from standby to active state.

Although a certain level of voltage drop may be accepted, the drop Vdrop exceeding a prescribed allowable range would significantly affect the high speed operation of the semiconductor device.

In the structure of FIG. 23, the threshold voltage of an N-channel MOS transistor N3 in a differential amplifier 40 of down-converting portion 536 varies depending on process variation and temperature. Bias current Ibias of the differential amplifier is determined by Vgs−Vth of N-channel MOS transistor N3, that is, VBGR−Vthn. Even if the bandgap-type reference potential generator is designed so that potential VBGR does not vary as described before, variation in threshold voltage Vthn causes significant variation in bias current Ibias.

In other words, as threshold voltage Vthn is increased, bias current Ibias is reduced. This may excessively increase the voltage drop Vdrop.

On the other hand, as threshold voltage Vthn is reduced, bias current Ibias is increased. This may significantly increase the standby current.

SUMMARY OF THE INVENTION

It is an object of the present invention to provide a semiconductor device that suppresses both increase in standby current caused by variation in threshold voltage and increase in drop of an internal power supply potential right after transition from standby to active state.

In summary, according to one aspect of the present invention, a semiconductor device includes a threshold compensating circuit and a differential amplifier.

The threshold compensating circuit outputs a control potential according to a threshold voltage of a MOS transistor. The differential amplifier amplifies a difference between a first input potential and a second input potential. The differential amplifier includes a first MOS transistor receiving the control potential at its gate, for determining a bias current of the differential amplifier according to the control potential.

According to another aspect of the present invention, a semiconductor device includes a differential amplifier.

The differential amplifier amplifies a difference between a first input potential and a second input potential. The differential amplifier includes a first MOS transistor receiving a control potential at its gate, for determining a bias current of the differential amplifier according to the control potential, and second and third MOS transistors having a threshold voltage higher than that of the first MOS transistor and forming a pair for differential amplification.

According to still another aspect of the present invention, a semiconductor device includes a reference potential generator, a level converter and a differential amplifier.

The reference potential generator receives an externally applied first power supply potential as an operating power supply potential and generates first and second reference potentials. The level converter boosts the first reference potential and outputs a control potential. The differential amplifier amplifies a difference between the second reference potential and a first input potential. The differential amplifier includes a first MOS transistor receiving the control potential at its gate, for determining a bias current of the differential amplifier according to the control potential.

Accordingly, a main advantage of the present invention is as follows: the bias current of the differential amplifier does not vary even when the threshold voltage varies. This suppresses current consumption and. enables implementation of a differential amplifier having a high response speed.

Another advantage of the present invention is as follows: when two types of transistors, transistors for high voltage and low voltage, are used, a transistor for low voltage is used as a transistor serving as a current source for determining a bias current. This suppresses both variation in bias current and current consumption and enables implementation of a differential amplifier having a high response speed.

Still another advantage of the present invention is as follows: a boosted reference potential is applied to the gate of a transistor serving as a current source for determining a bias current. This suppresses both variation in bias current and current consumption and enables implementation of a differential amplifier having a high response speed.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 10 is a truth table showing input/output values of a logic circuit 70.

DESCRIPTION OF THE PREFERRED EMBODIMENTS

Figure 1:
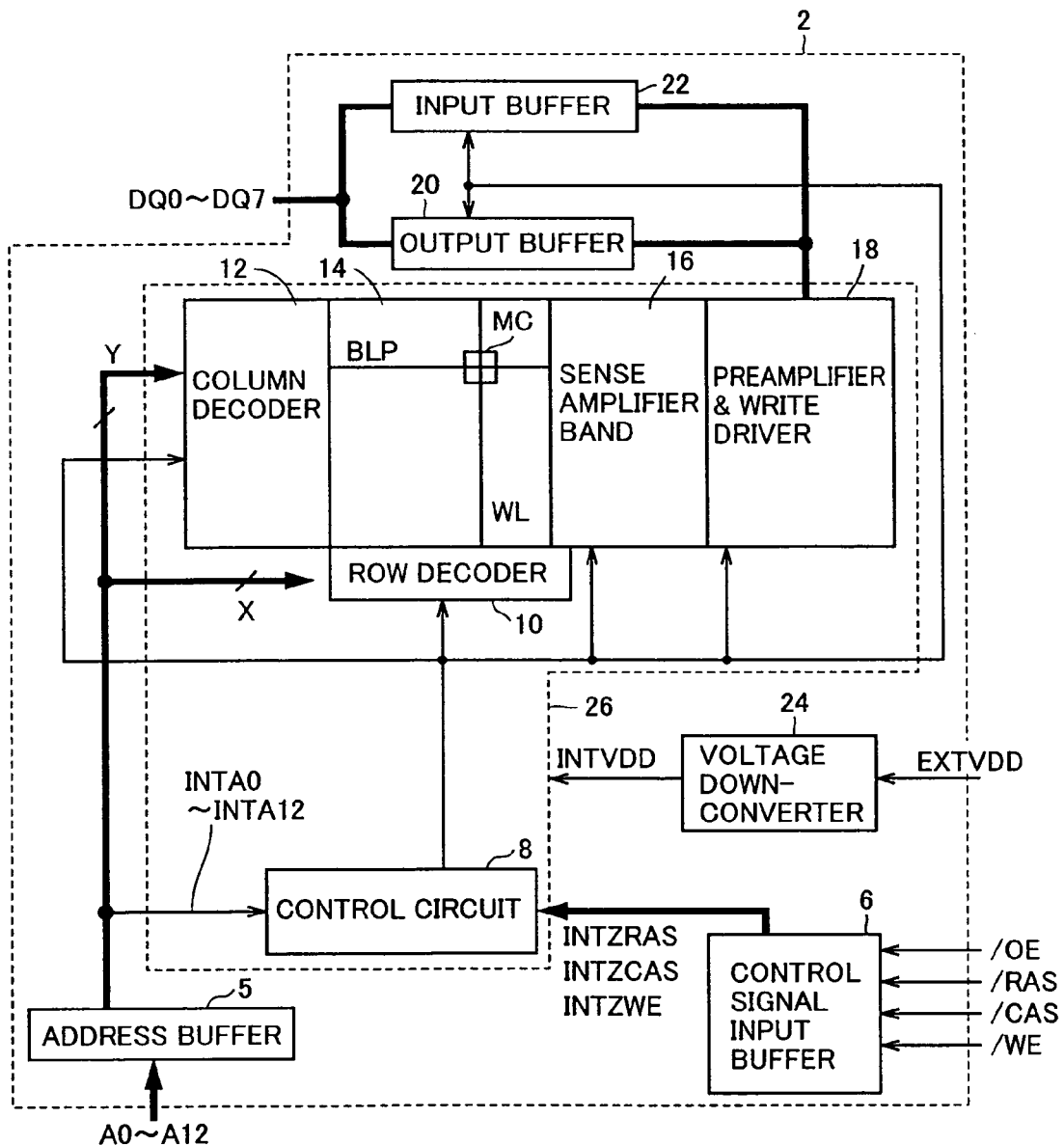
FIG. 1 is a schematic block diagram showing the structure of a semiconductor device 2 according to the present invention.

Hereinafter, embodiments of the present invention will be described in detail with reference to the accompanying drawings. Note that the same reference numerals and characters denote the same or corresponding portions throughout the figures.

First Embodiment

FIG. 1 is a schematic block diagram showing the structure of a semiconductor device 2 according to the present invention. A dynamic random access memory (DRAM) is herein shown as an example of the semiconductor device. However, the present invention is not limited to DRAM, and is also applicable to other semiconductor devices including a voltage down-converter.

Referring to FIG. 1, semiconductor device 2 includes a memory cell array 14 having a plurality of memory cells arranged in a matrix, an address buffer 5 for receiving address signals A0 to A12 and outputting an internal row address X and an internal column address Y, and a control signal input buffer 6 for receiving control signals /OE, /RAS, /CAS, /WE and outputting internal control signals INTZRAS, INTZCAS, INTZWE.

Memory cell array 14 includes memory cells MC arranged in a matrix, a plurality of word lines WL provided corresponding to the memory cell rows, and bit line pairs BLP provided corresponding to the memory cell columns. FIG. 1 exemplarily shows only one memory cell MC, one word line WL and one bit line pair BLP.

Semiconductor device 2 further includes a control circuit 8 for receiving internal address signals INTA0 to INTA12 from address buffer 5 and internal control signals INTZRAS, INTZCAS, INTZWE from control signal input buffer 6 and outputting a control signal to each block.

Semiconductor device 2 further includes a row decoder 10 for decoding an internal row address X received from address buffer 5. Row decoder 10 includes a word driver for driving an addressed row (word line) in memory cell array 14 to the selected state.

Semiconductor device 2 further includes a column decoder 12 for decoding an internal column address Y received from address buffer 5 and generating a column selection signal, and a sense amplifier band 16 having a plurality of sense amplifiers arranged therein for sensing and amplifying data in a memory cell MC connected to the selected row in memory cell array 14.

Semiconductor device further includes an input buffer 22 for receiving external write data and producing internal write data, a write driver for amplifying the internal write data from input buffer 22 for transmission to the selected memory cell, a preamplifier for amplifying data read from the selected memory cell, and an output buffer 20 for buffering the data from the preamplifier for output to the outside.

In FIG. 1, the preamplifier and the write driver are shown as one block 18.

Semiconductor device 2 further includes a voltage down-converter 24 for down-converting an external power supply potential EXTVDD and outputting an internal power supply potential INTVDD. Power supply potential INTVDD is applied to a load circuit 26. Load circuit 26 includes control circuit 8, row decoder 10, column decoder 12, memory cell array 10, sense amplifier band 16 and block 18, which are described before.

Figure 2:
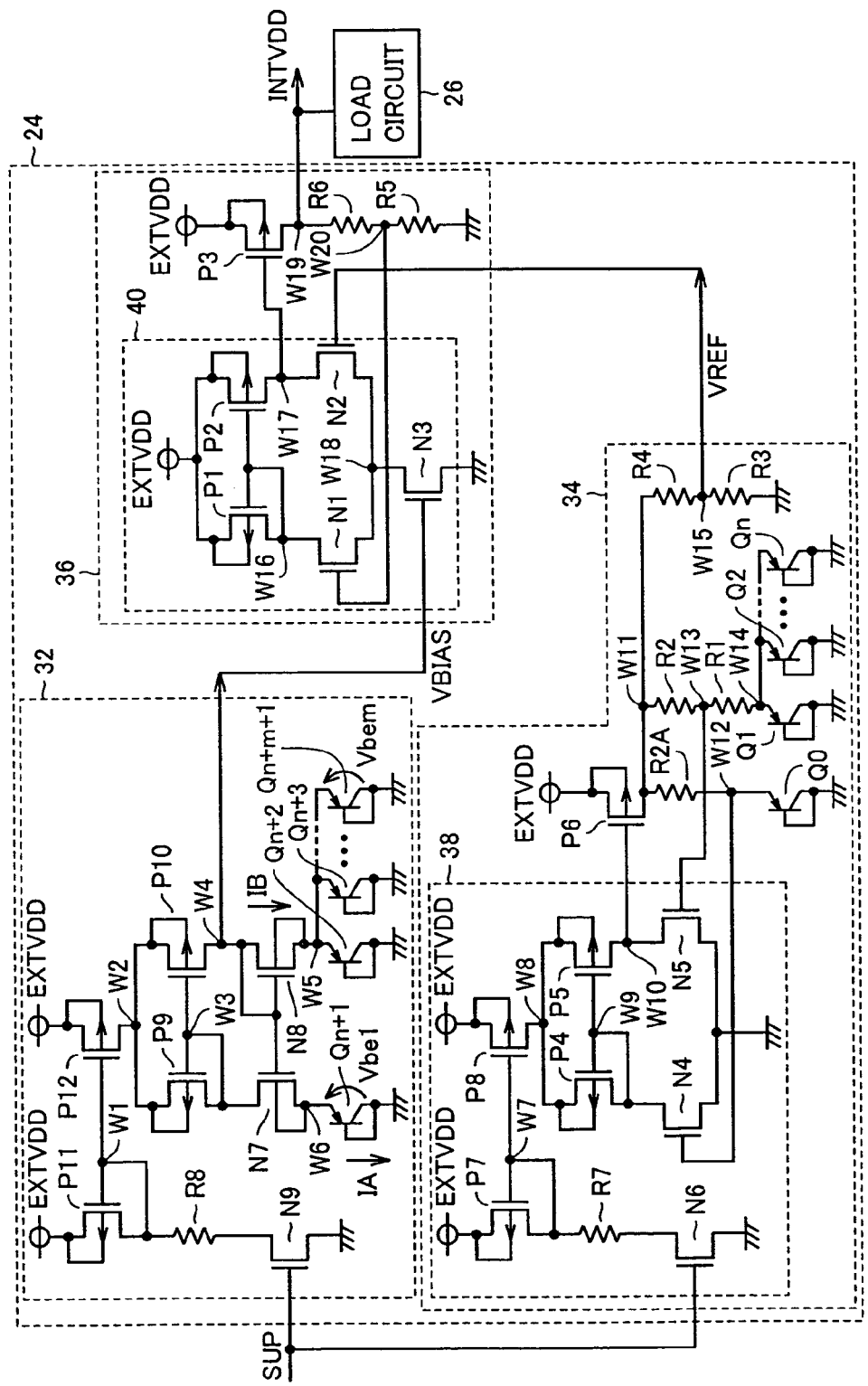
FIG. 2 is a circuit diagram showing the structure of a voltage down-converter 24.

FIG. 2 is a circuit diagram showing the structure of voltage down-converter 24.

Referring to FIG. 2, voltage down-converter 24 includes a reference potential generator 34 activated in response to an activation signal SUP, for outputting a reference potential VREF, a threshold compensating circuit 32 activated in response to activation signal SUP, for outputting a bias potential VBIAS, and a down-converting portion 36 for down-converting a power supply potential EXTVDD based on reference potential VREF and bias potential VBIAS and outputting a power supply potential INTVDD.

Reference potential generator 34 includes a differential amplifier 38 for comparing respective potentials on nodes W12, W13 with each other and controlling a potential on a node W10, a P-channel MOS transistor P6 connected between a node receiving power supply potential EXTVDD and a node W11 and having its gate connected to node W10, a resistor R2A connected between nodes W11, W12, and a pnp transistor Q0 having its emitter connected to node W12 and its base and collector connected to a ground node. The back gate of P-channel MOS transistor P6 is coupled to power supply potential EXTVDD. In the figure, resistor R2A has the same resistance value as that of a resistor R2.

Reference potential generator 34 further includes a resistor R2 connected between nodes W11, W13, a resistor R1 connected between nodes W13, W14, n pnp transistors Q1 to Qn each having its emitter connected to node W14 and its base and connector connected to the ground node, a resistor R4 connected between nodes W11 , W15, and a resistor R3 connected between node W15 and ground node.

Since pnp transistors can be relatively easily fabricated in a semiconductor device integrating CMOS transistors, such circuitry is commonly used. Each pnp transistor Q0 to Qn has its base and collector connected to each other, and therefore operation thereof is equivalent to that of a diode. Alternatively, n pnp transistors Q1 to Qn may be replaced with a single large pnp transistor having a pn junction area that is n times that of pnp transistor Q0.

Differential amplifier 38 includes a P-channel MOS transistor P7 having its source and back gate connected to power supply potential EXTVDD and its gate and drain connected to a node W7, a resistor R7, and an N-channel MOS transistor N6. Resistor R7 and N-channel MOS transistor N6 are connected in series between node W7 and ground node. An activation signal SUP is applied to the gate of N-channel MOS transistor N6.

Differential amplifier 38 further includes a P-channel MOS transistor P8, a P-channel MOS transistor P4, an N-channel MOS transistor N4, a P-channel MOS transistor P5, and an N-channel MOS transistor N5. P-channel MOS transistor P8 has its source and back gate coupled to power supply potential EXTVDD, its gate connected to node W7 and its drain connected to a node W8. P-channel MOS transistor P4 has its back gate and source connected to node W8 and its gate and drain connected to a node W9. N-channel MOS transistor N4 has its drain connected to node W9, its gate connected to node W12 and its source connected to the ground node. P-channel MOS transistor P5 has its back gate and source connected to node W8, its gate connected to node W9 and its drain connected to node W10. N-channel MOS transistor N5 has its drain connected to node W10, its gate connected to node W13, and its source connected to the ground node.

Like the reference potential generator of the conventional example, reference potential generator 34 is designed so that reference voltage VREF is less likely to vary depending on power supply voltage, process variation and temperature.

Down-converting portion 36 includes a differential amplifier 40 for comparing a potential on a node W20 with reference potential VREF and controlling a potential on a node W17, a P-channel MOS transistor P3, a resistor R6 connected between nodes W19, W20, and a resistor R5 connected between node W20 and ground node. P-channel MOS transistor P3 has its source and back gate coupled to power supply potential EXTVDD, its gate connected to node W17 and its drain connected to node W19.

A voltage divider formed by resistors R5, R6 implements a voltage down-converter capable of operating even at a low reference potential.

Differential amplifier 40 includes a P-channel MOS transistor P1, an N-channel MOS transistor N1, a P-channel MOS transistor P2, an N-channel MOS transistor N2, and an N-channel MOS transistor N3. P-channel MOS transistor P1 has its source and back gate coupled to power supply potential EXTVDD, and its gate and drain connected to a node W16. N-channel MOS transistor N1 is connected between nodes W16, W18, and has its gate connected to node W20. P-channel MOS transistor P2 has its source and back gate coupled to power supply potential EXTVDD, its gate connected to node W16, and its drain connected to node W17. N-channel MOS transistor N2 is connected between nodes W17, W18 and receives reference potential VREF at its gate. N-channel MOS transistor N3 is connected between node N18 and ground node and receives bias potential VBIAS at its gate.

Power supply potential INTVDD is output from node W19 of down-converting circuit 36. Power supply potential INTVDD, which is lower than external power supply potential EXTVDD, is applied to load circuit 26.

Threshold compensating circuit 32 includes a P-channel MOS transistor P11, a resistor R8 and an N-channel MOS transistor N9. P-channel MOS transistor P11 has its source and back gate coupled to power supply potential EXTVDD, and its gate and drain connected to a node W1. Resistor R8 and N-channel MOS transistor N9 are connected in series between node W1 and ground node. An activation signal SUP is applied to the gate of N-channel MOS transistor N9. Threshold compensating circuit 32 further includes a P-channel MOS transistor P12, a P-channel MOS transistor P9, an N-channel MOS transistor N7 and a pnp transistor Qn+1. P-channel MOS transistor P12 has its back gate and source coupled to power supply potential EXTVDD, its gate connected to node W1, and its source connected to a node W2. P-channel MOS transistor P9 has its source and back gate connected to node W2 and its gate and drain connected to a node W3. N-channel MOS transistor N7 has its drain connected to node W3, its gate connected to node W4, and its back gate and source connected to a node W6, and pnp transistor Qn+1 has its emitter connected to node W6, and its base and collector connected to the ground node.

Threshold compensating circuit 32 further includes a P-channel MOS transistor P10, an N-channel MOS transistor N8, and m pnp transistors Qn+2 to Qn+m+1. P-channel MOS transistor P10 has its source and back gate connected to node W2, its gate connected to node W3, and its drain connected to a node W4. N-channel MOS transistor N8 has its gate and drain connected to node W4, and its source and back gate connected to a node W5. Each pnp transistor Qn+2 to Qn+m+1 has its emitter connected to node W5 and its base and collector connected to the ground node.

Hereinafter, bias potential VBIAS output from threshold compensating circuit 32 will be described. Transistors P9, P10, N7, N8 are operated in a saturated region. A drain-source current Ids of a MOS transistor operating in the saturated region is given by the following expressions:

$$Ids = \frac{1}{2}\mu p \cdot Cox \cdot \frac{W}{L}(Vgs + Vthp)^2 \quad (p\text{-channel}); \text{ and}$$

$$Ids = \frac{1}{2}\mu n \cdot Cox \cdot \frac{W}{L}(Vgs - Vthn)^2 \quad (n\text{-channel}).$$

It is herein assumed hat P-channel MOS transistors P9, P10 have the same mobility μp and the same threshold voltage Vthp, and N-channel MOS transistors N7, N8 have the same mobility μn and the same threshold voltage Vthn.

It is assumed that P-channel MOS transistor P9 has a gate width W9 and a gate length L9, and P-channel MOS transistor P10 has a gate width W10 and a gate length L10.

P-channel MOS transistors P9, P10 form a current mirror and have the same ratio of gate width to gate length (hereinafter, referred to as ratio W/L). Therefore, IA=IB in FIG. 2.

From the above description, the following expressions are obtained:

$$IA = \frac{1}{2}\mu n \cdot Cox \cdot \frac{W7}{L7}(VBIAS - Vbel - Vthn)^2 \quad (10)$$

$$IB = \frac{1}{2}\mu n \cdot Cox \cdot \frac{W8}{L8}(VBIAS - Vbem - Vthn)^2. \quad (11)$$

Therefore, $$\frac{1}{2}\mu n \cdot Cox \cdot \frac{W7}{L7}(VBIAS - Vbel - Vthn)^2 \quad (12)$$

$$= \frac{1}{2}\mu n \cdot Cox \cdot \frac{W8}{L8}(VBIAS - Vbem - Vthn)^2$$

$$\therefore \sqrt{\frac{W7}{L7}}(VBIAS - Vbel - Vthn) \quad (13)$$

$$= \sqrt{\frac{W8}{L8}}(VBIAS - Vbem - Vthn).$$

A current flowing through the diode is defined by the above expression (2). Therefore, provided that $I_{SA}$ is a saturation current of diode-connected pnp transistor Qn+1, the following expression (14) is obtained. Since diode-connected pnp transistors Qn+2 to Qn+m+1 are equivalent to m pnp transistors Qn+1 arranged in parallel, a saturation current $I_{SB}$ of diode-connected pnp transistors Qn+2 to Qn+m+1 is $mI_{SA}$. Therefore, the following expression (15) is obtained:

$$IA = I_{SA} \cdot e^{\frac{qVbel}{kT}}. \quad (14)$$

Therefore, $$IB = mI_{SA} \cdot e^{\frac{qVbem}{kT}}. \quad (15)$$

The following expressions (16), (17) are obtained from the above expressions:

$$\therefore I_{SA} \cdot e^{\frac{qVbel}{kT}} = mI_{SA} \cdot e^{\frac{qVbem}{kT}} \quad (16)$$

$$= \frac{qVbel}{kT} = \ln(m) + \frac{qVbem}{kT}$$

$$\therefore Vbel - Vbem = \frac{kT}{q}\ln(m)$$

$$\therefore Vbem = Vbel - \frac{kT}{q}\ln(m)$$

By substituting the expression (16) for the expression (13), $$\sqrt{\frac{W7}{L7}}(VBIAS - Vbel - Vthn) \quad (17)$$

$$= \sqrt{\frac{W8}{L8}}\left(VBIAS - Vbel + \frac{kT}{q}\ln(m) - Vthn\right)$$

$$\left(\sqrt{\frac{W7}{L7}} - \sqrt{\frac{W8}{L8}}\right)VBIAS = \left(\sqrt{\frac{W7}{L7}} - \sqrt{\frac{W8}{L8}}\right)Vbel +$$

$$\sqrt{\frac{W8}{L8}}\frac{kT}{q}\ln(m) +$$

$$\left(\sqrt{\frac{W7}{L7}} - \sqrt{\frac{W8}{L8}}\right)Vthn$$

$$\therefore VBIAS = Vbel + \frac{\sqrt{\frac{W8}{L8}}}{\sqrt{\frac{W7}{L7}} - \sqrt{\frac{W8}{L8}}}\frac{kT}{q}\ln(m) + Vthn.$$

A base-emitter voltage Vbe1 of pnp transistor Qn+1 is a voltage substantially determined by a material, and is known as a voltage having little variation. For this reason, a bandgap-type reference potential generator is recently used more than other circuits such as a Vth voltage-difference-type reference potential generator utilizing a threshold voltage Vth of a MOS transistor.

A coefficient of the second term in the expression (17) is in the form of a ratio of the ratio W/L, and basically is not affected by manufacturing variation. Moreover, k/q is a physical constant, and m is the number of diode-connected pnp transistors connected in parallel between node W5 and ground node. Therefore, m cannot be varied. Accordingly, without the influence of the temperature T, bias potential VBIAS is affected only by variation in threshold voltage Vthn.

Hereinafter, the influence of the temperature will be described. By differentiating the expression (17) with respect to temperature T, the following expression (18) is obtained:

$$\frac{\partial VBIAS}{\partial T} = \frac{\partial Vbel}{\partial T} + \frac{\sqrt{\frac{W8}{L8}}}{\sqrt{\frac{W7}{L7}} - \sqrt{\frac{W8}{L8}}} \frac{k}{q} \ln(m) + \frac{\partial Vthn}{\partial T}. \quad (18)$$

Voltage Vbe1 has negative temperature characteristics, and $\partial Vbel/\partial T$ is known to be about $-2$ mV/° C. Physical constant $k/q = 8.625 \times 10^{-2}$ mV/° C.

By determining the values $$\frac{W7}{L7}, \frac{W8}{L8}, m$$

in the expression (18) so as to satisfy the following expression (19):

$$\frac{\partial Vbel}{\partial T} + \frac{\sqrt{\frac{W8}{L8}}}{\sqrt{\frac{W7}{L7}} - \sqrt{\frac{W8}{L8}}} \frac{kT}{q} \ln(m) = -2 \text{ mV}/° \text{C.} + \quad (19)$$

$$\frac{\sqrt{\frac{W8}{L8}}}{\sqrt{\frac{W7}{L7}} - \sqrt{\frac{W8}{L8}}} \ln(m) \times 8.625 \times 10^{-2} \text{ mV}/° \text{C.} = 0,$$

$$\frac{\partial VBIAS}{\partial T} = \frac{\partial Vthn}{\partial T}.$$

As a result, VBIAS has only the temperature dependency of Vthn.

From the expression (19), $$\frac{\sqrt{\frac{W8}{L8}}}{\sqrt{\frac{W7}{L7}} - \sqrt{\frac{W8}{L8}}} \ln(m) = 23.188. \quad (20)$$

Provided that $m = 10$, $$\frac{\sqrt{\frac{W8}{L8}}}{\sqrt{\frac{W7}{L7}} - \sqrt{\frac{W8}{L8}}} = 10.07$$

$$\sqrt{\frac{W8}{L8}} = 10.07 \left( \sqrt{\frac{W7}{L7}} - \sqrt{\frac{W8}{L8}} \right)$$

$$11.07 \sqrt{\frac{W8}{L8}} = 10.07 \sqrt{\frac{W7}{L7}}$$

$$\therefore \sqrt{\frac{W7}{L7} \cdot \frac{L8}{W8}} = 0.91.$$

Accordingly, W7/L7 and W8/L8 need only be determined so as to satisfy the expression (20).

Bias potential VBIAS is equal to threshold voltage Vth offset by a given value. Therefore, bias potential VBIAS has the same temperature characteristics as those of threshold voltage Vthn. As described before, a saturation current of transistor N3 is a function of Vgs–Vthn. This value is independent of variation in threshold voltage Vthn, as shown by the following expression (21):

$$Vgs - Vth = VBIAS - Vthn \quad (21)$$

$$= Vbel + \frac{\sqrt{\frac{W8}{L8}}}{\sqrt{\frac{W7}{L7}} - \sqrt{\frac{W8}{L8}}} * \frac{k}{q} * \ln(m).$$

According to the first embodiment, variation in bias current Ibias caused by variation in threshold voltage Vthn can be suppressed.

Note that, in the first embodiment, pnp transistors are used as transistors Q0 to Qn+m+1 in the circuit of FIG. 2. However, npn transistors may alternatively be used. In the circuit of FIG. 2, transistors Qn+2 to Qn+m+1 may be replaced with a single pnp transistor having a junction area that is m times that of transistor Qn+1 so as to satisfy the expression (15).

Second Embodiment

Figure 3:
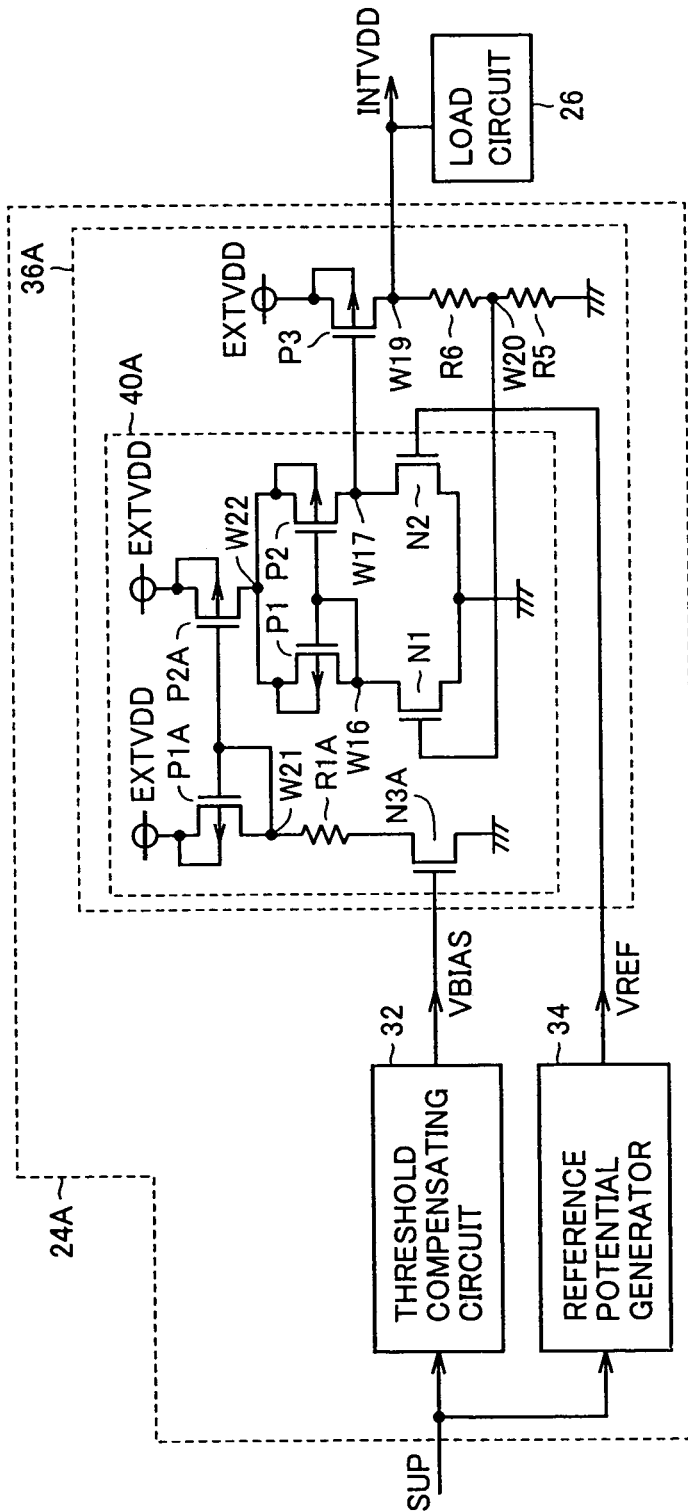
FIG. 3 is a circuit diagram showing the structure of a voltage down-converter 24A according to a second embodiment of the present invention.

FIG. 3 is a circuit diagram showing the structure of a voltage down-converter 24A according to the second embodiment of the present invention.

Referring to FIG. 3, voltage down-converter 24A includes a down-converting portion 36A instead of down-converting portion 36 in voltage down-converter 24 of FIG. 2.

Down-converting portion 36A includes a differential amplifier 40A instead of differential amplifier 40 in down-converting circuit 36 of FIG. 2. Since the structure of voltage down-converter 24A and down-converting portion 36A is otherwise the same as that described in connection with FIG. 2, description thereof will not be repeated.

Differential amplifier 40A includes a P-channel MOS transistor P1A, a resistor R1A and an N-channel MOS transistor N3A. P-channel MOS transistor P1A has its source and back gate coupled to a power supply potential EXTVDD, and its gate and drain connected to a node W21. Resistor R1A and N-channel MOS transistor N3A are connected in series between node W21 and ground node. A bias potential VBIAS is applied to the gate of N-channel MOS transistor, N3A.

Differential amplifier 40A further-includes a P-channel MOS-transistor P2A, a P-channel MOS transistor P1, an N-channel MOS transistor N1, a P-channel MOS transistor P2 and an N-channel MOS transistor N2. P-channel MOS transistor P2A has its source and back gate coupled to power supply potential EXTVDD, its gate connected to node W21, and its drain connected to a node W22. P-channel MOS transistor P1 has its source and back gate connected to node W22, and its gate and drain connected to a node W16. N-channel MOS transistor N1 is connected between node W16 and ground node, and has its gate connected to a node W20. P-channel MOS transistor P2 has its source and back gate connected to node W22, its gate connected to node W16, and its drain connected to a node W17. N-channel MOS transistor N2 is connected between node W17 and ground node and receives a reference potential VREF at its gate.

In the first embodiment, N-channel MOS transistor N3 serving as a current source of differential amplifier 40 of FIG. 2 is connected to the sources of N-channel MOS transistors N1, N2.

In order to improve the effects of threshold compensating circuit 32 of the first embodiment, it is desirable to operate N-channel MOS transistor N3 in the saturated region. The reason for this is as follows: as described before, when N-channel MOS transistor N3 operates in the saturated region, bias current Ibias is not dependent on a drain potential Vd, and is determined only by Vgs–Vthn.

In the circuit of FIG. 2, however, operating N-channel MOS transistor N3 in the saturated region would increase the source potential of transistors N1, N2, that is, the potential on node W18. Therefore, at a low reference potential VREF, a sufficient bias level cannot be assured for transistors N1, N2, thereby degrading responsiveness. Particularly at a low power supply potential EXTVDD, it is difficult to generate a high reference potential VREF. Therefore, the above problem is likely to occur, and it is difficult to operate transistor N3 in the saturated region.

In the structure of FIG. 3, transistor P2A serves as a current source of the differential amplifier. The current amount can be determined by a bias potential applied to an N-channel MOS transistor N3A. In this structure, the sources of transistors N1, N2 are fixed to the ground potential. Accordingly, N-channel MOS transistor N3A can be operated in the saturated region even when different amplifier 40A receives a low input potential.

Third Embodiment

Figure 4:
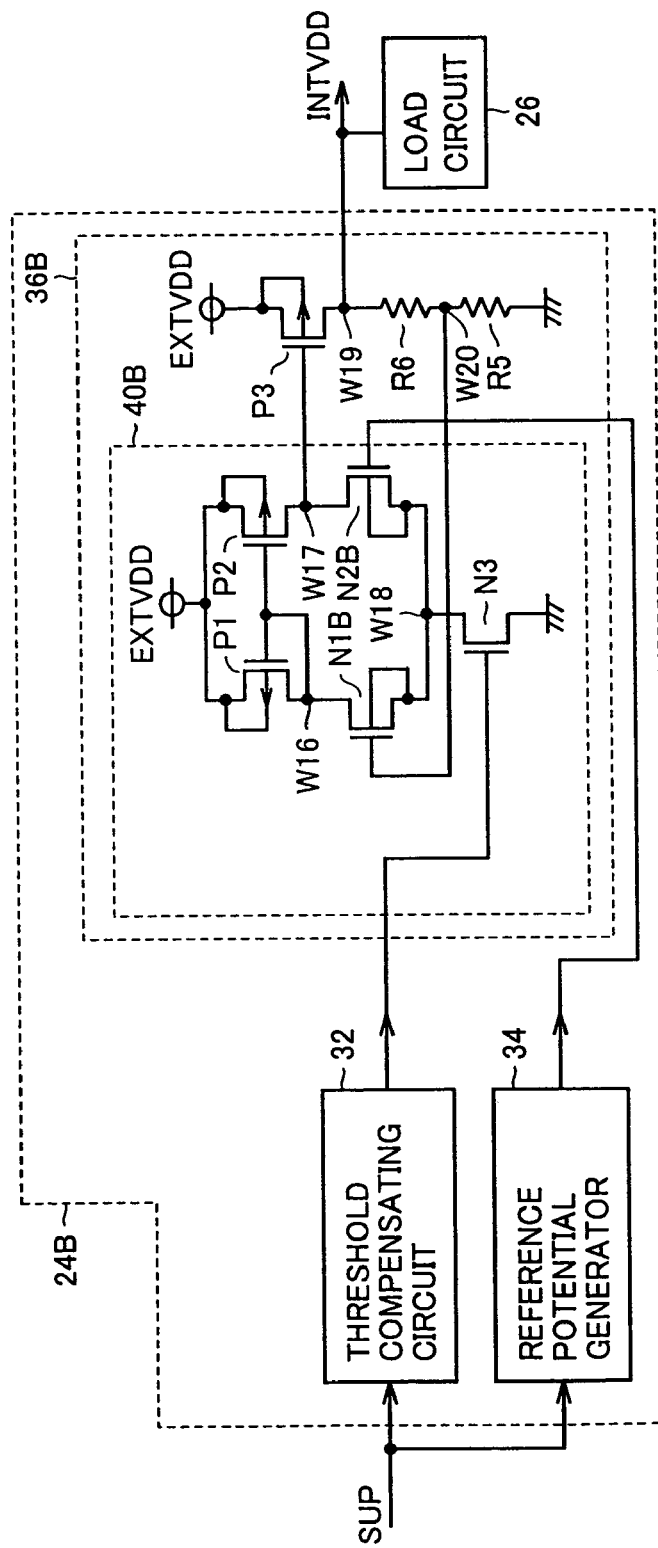
FIG. 4 is a circuit diagram showing the structure of a voltage down-converter 24B according to a third embodiment of the present invention.

FIG. 4 is a circuit diagram showing the structure of a voltage down-converter 24B according to the third embodiment of the present invention.

Referring to FIG. 4, voltage down-converter 24B includes a down-converting portion 36B instead of down-converting portion 36 in voltage down-converter 24 of FIG. 2. Down-converting portion 36B includes a differential amplifier 40B instead of differential amplifier 40 in down-converting portion 36 of FIG. 2. Differential amplifier 40B includes N-channel MOS transistors N1B, N2B instead of N-channel MOS transistors N1, N2 in differential amplifier 40. Since the structure of voltage down-converter 24B is otherwise the same as that of voltage down-converter 24 in FIG. 2, description thereof will not be repeated.

Each N-channel MOS transistor N1B, N2B has its back gate and source connected to each other. In FIG. 2, the respective back gates of N-channel MOS transistors N1, N2 are connected to the ground potential. As a result, the potential on node W18 increases depending on the input voltage, whereby threshold voltage Vthn of N-channel MOS transistors N1, N2 is increased due to the back gate effect (substrate bias effect). This is substantially equivalent to reduction in reference potential VREF, thereby possibly causing the same problems as those of the second embodiment.

In the third embodiment, in order to prevent such problems, the source and back gate are connected to each other so that the source-back gate voltage Vbs is equal to 0 V. As a result, variation in threshold value caused by the back gate effect can be eliminated.

Fourth Embodiment

Figure 5:
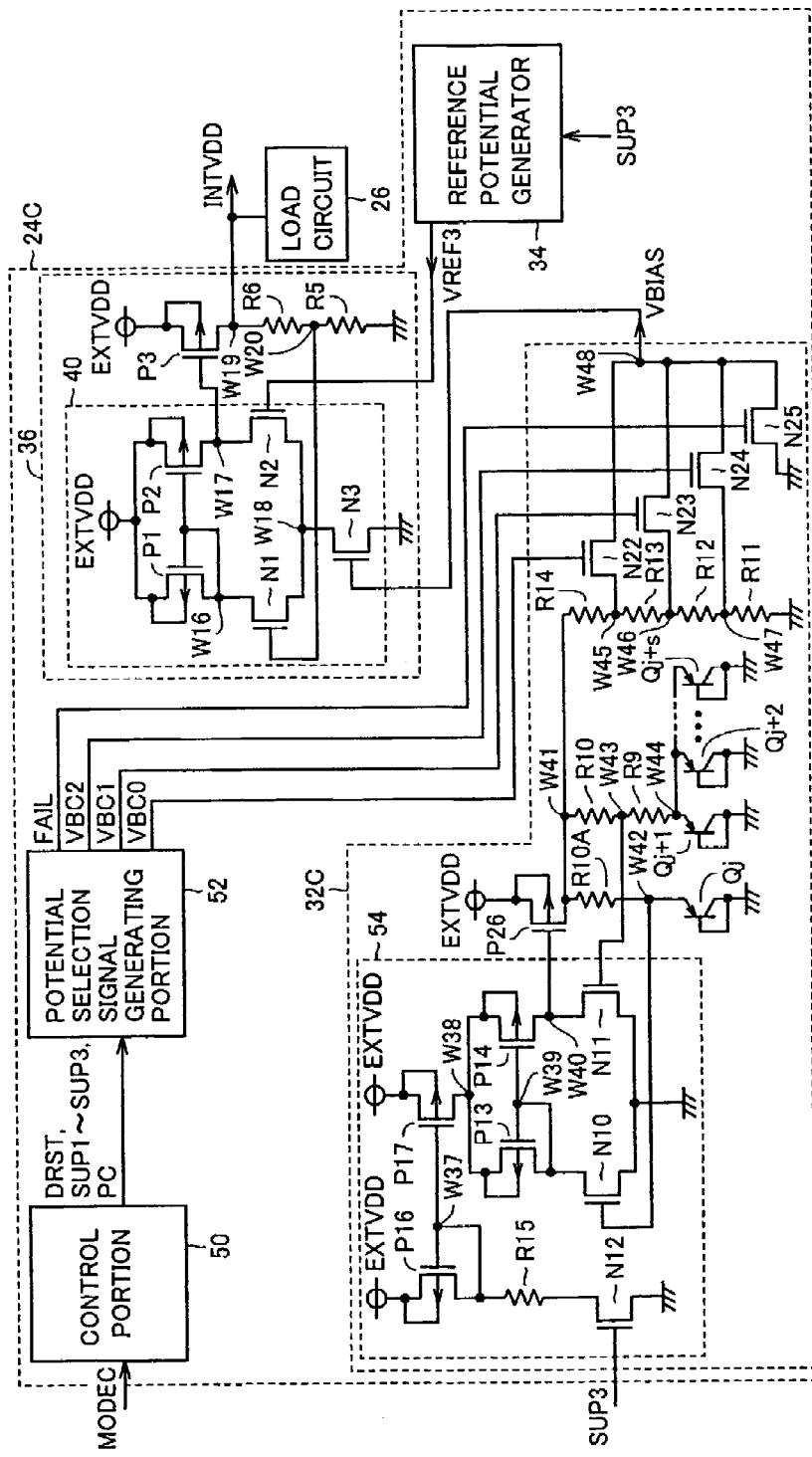
FIG. 5 is a circuit diagram showing the structure of a voltage down-converter 24C according to a fourth embodiment of the present invention.

FIG. 5 is a circuit diagram showing the structure of a voltage down-converter 24C according to the fourth embodiment of the present invention.

Referring to FIG. 5, voltage down-converter 24C includes a control portion 50, a potential selection signal generating portion 52, a reference potential generator 32C, a reference potential generator 34, and a down-converting portion 36. Control portion 50 outputs a data reset signal DRST, activation signals SUP1 to SUP3 and a precharge signal PC as control signals in response to a mode signal MODEC. Mode signal MODEC is a signal for giving an instruction to compensate for a bias potential when power is turned ON. Potential selection signal generating portion 52 outputs selection signals VBC0 to VBC2 and a failure signal FAIL in response to the output of control portion 50. Reference potential generator 32C generates a plurality of reference potentials in response to activation signal SUP3, and selects a bias potential VBIAS from the plurality of reference potentials in response to potential selection signals VBC0 to VBC2 for output. Reference voltage generator 34 is activated in response to activation signal SUP3 and outputs a reference potential VREF3. Down-converting portion 36 down-converts a power supply potential EXTVDD based on reference potential VREF3 and bias potential VBIAS and outputs a power supply potential INTVDD.

Potential selection signal generating portion 52 and reference potential generator 32C forms a compensating circuit that is equivalent to threshold compensating circuit 32 in FIG. 2.

Since the structure of down-converting portion 36 is the same as that of down-converting portion 36 in FIG. 2, description thereof will not be repeated. Moreover, since the structure of reference potential generator 34 is the same as that of reference potential generator 34 in FIG. 2, description thereof will not be repeated.

Reference potential generator 32C includes a differential amplifier 54, a P-channel MOS transistor P26, a resistor 10A, and a pnp transistor Qj. Differential amplifier 54 compares respective potentials on nodes W42, W43 with each other and controls a potential on a node W40. P-channel MOS transistor P26 is connected between a node receiving a power supply potential EXTVDD and a node W41, and has its gate connected to node W40. Resistor R10A is connected between nodes W41, W42, and pnp transistor Qj has its emitter connected to node W42 and its base and collector connected to the ground node. The back gate of P-channel MOS transistor P26 is coupled to power supply potential EXTVDD.

Reference potential generator 32C further includes a resistor R10 connected between nodes W41, W43, a resistor R9 connected between nodes W43, W44, and s pnp transistors Qj+1 to Qj+s each having its emitter connected to node W44 and its base and collector connected to the ground node.

Reference potential generator 32C further includes four resistors R11 to R14 connected in series between node W41 and ground node in order to divide a potential on node W41. Resistor R11 is connected between node W47 and ground node. Resistor R12 is connected between nodes W46, W47. Resistor R13 is connected between nodes W45, W46. Resistor R14 is connected between nodes W41, W45.

Reference potential generator 32C further includes N-channel MOS transistors N22, N23, N24, N25. N-channel MOS transistor N22 is connected between nodes W45, W48 and receives a selection signal VBC0 at its gate. N-channel MOS transistor N23 is connected between nodes W46, W48 and receives a selection signal VBC1 at its gate. N-channel MOS transistor N24 is connected between nodes W47, W48 and receives a selection signal VBC2 at its gate. N-channel MOS transistor N25 is connected between ground node and node W48 and receives a failure signal FAIL at its gate. Selected bias potential VBIAS is output from node W48.

Differential amplifier 54 includes a P-channel MOS transistor P16, a resistor R15 and an N-channel MOS transistor N12. P-channel MOS transistor P16 has its source and back gate coupled to power supply potential EXTVDD and its gate and drain connected to a node W37. Resistor R15 and N-channel MOS transistor N12 are connected in series between node W37 and ground node. Activation signal SUP3 is applied to the gate of N-channel MOS transistor N12.

Differential amplifier 54 further includes a P-channel MOS transistor P17, a P-channel MOS transistor P13, an N-channel MOS transistor N10, a P-channel MOS transistor P14 and an N-channel MOS transistor N11. P-channel MOS transistor P17 has its source and back gate coupled to power supply potential EXTVDD, its gate connected to a node W37 and its drain connected to node W38. P-channel MOS transistor P13 has its back gate and source connected to node W38, and its gate and drain connected to a node W39. N-channel MOS transistor N10 has its drain connected to node W39, its gate connected to node W42, and its source connected to the ground node. P-channel MOS transistor P14 has its back gate and source connected to node W38, its gate connected to node W39 and its drain connected to node W40. N-channel MOS transistor N11 has its drain connected to node W40, its gate connected to node W43 and its source connected to the ground node.

Like reference potential generator 34 in FIG. 2, reference potential generator 32C is designed so that potentials on nodes W45 to W47 are less likely to vary depending on power supply voltage, process variation and temperature. When any one of transistors N22 to N24 is turned ON, the output voltage is determined as follows:

a) When transistor N22 is turned ON:

$$VBIAS = \frac{R11+R12+R13}{R11+R12+R13+R14}\left(Vbel + \frac{R10}{R9}\frac{kT}{q}\ln(s)\right) = 0.9 \text{ V}$$

b) When transistor N23 is turned ON:

$$VBIAS = \frac{R11+R12}{R11+R12+R13+R14}\left(Vbel + \frac{R10}{R9}\frac{kT}{q}\ln(s)\right) = 0.8 \text{ V}$$

c) When transistor N24 is turned ON:

$$VBIAS = \frac{R11}{R11+R12+R13+R14}\left(Vbel + \frac{R10}{R9}\frac{kT}{q}\ln(s)\right) = 0.7 \text{ V}.$$

Note that resistors R10A, R10, R9 are formed from the same material. Resistors R10A, R10 have the same resistance value. R10/R9 is determined so that ∂VBIAS/∂T=0.

Resistors R11, R12, R13, R14 are formed from the same material. The material of resistors R11, R12, R13, R14 is determined so that bias potential VBIAS satisfies the above expressions, i.e., so that bias potential VBIAS is 0.9 V, 0.8 V, 0.7 V when transistor N22, N23, N24 is turned ON, respectively.

Figure 6:
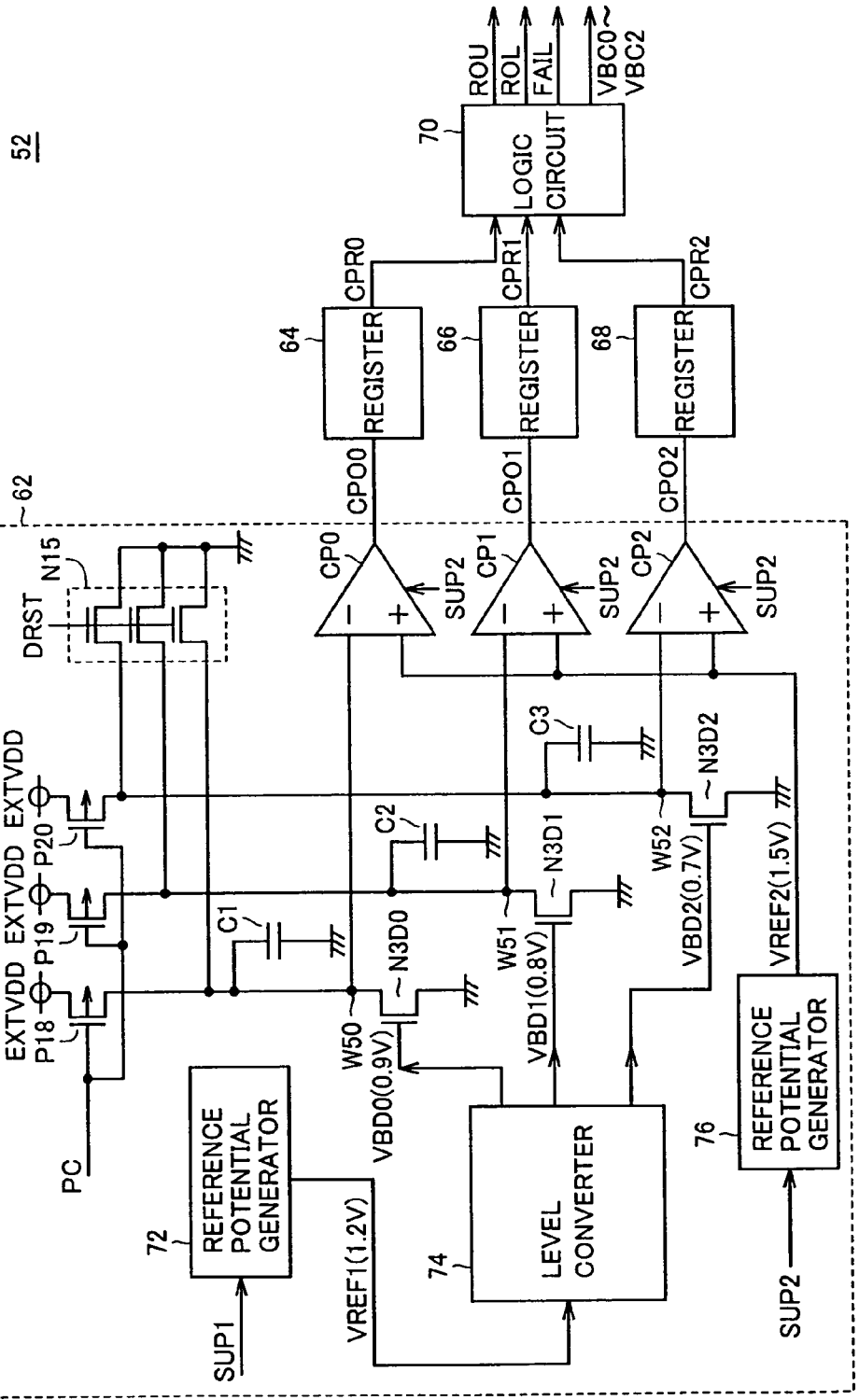
FIG. 6 is a circuit diagram showing the structure of a potential selection signal generating portion 52 in FIG. 5.

FIG. 6 is a circuit diagram showing the structure of potential selection signal generating portion 52 in FIG. 5.

Referring to FIG. 6, potential selection signal generating portion 52 includes a preprocessing circuit 62, registers 64, 66, 68 and a logic circuit 70. Preprocessing circuit 62 conducts preprocessing according to the output of control portion 50. Registers 64, 66, 68 receive output signals CPO0 to CPO2 of preprocessing circuit 62, respectively. Logic circuit 70 receives respective output signals CPR0, CPR1, CPR2 of registers 64, 66, 68 and outputs signals ROU, ROL, failure signal FAIL and selection signals VBC0 to VBC2.

Preprocessing circuit 62 includes a reference potential generator 72, a level converter 74, and a reference potential generator 76. Reference potential generator 72 is activated in response to activation signal SUP1 and outputs a reference potential VREF1 (e.g., 1.2 V). Level converter 74 converts the level of reference potential VREF1 and outputs potentials VRB0 (e.g., 0.9 V), VBD1 (e.g., 0.8 V), VBD2 (e.g., 0.7 V). Reference potential generator 76 is activated in response to activation signal SUP2 and outputs a reference potential VREF2 (e.g., 1.5 V).

The structure of reference potential generators 72, 76 is the same as that of reference potential generator 34 in FIG. 2 except the ratio between resistors R3, R4. Therefore, description thereof will not be repeated.

Preprocessing circuit 62 further includes a P-channel MOS transistor P18, a capacitor C1 and an N-channel MOS transistor N3D0. P-channel MOS transistor P18 is connected between a node receiving power supply potential EXTVDD and a node W50 and receives a precharge signal PC at its gate. Capacitor C1 is connected between node W50 and ground node. N-channel MOS transistor N3D0 is connected between node W50 and ground node and receives a potential VBD0 at its gate. Note that capacitor C1 has the same capacitance value as that of capacitors C2, C3 described below.

Preprocessing circuit 62 further includes a P-channel MOS transistor P19, a capacitor C2 and an N-channel MOS transistor N3D1, P-channel MOS transistor P19 is connected between the node receiving power supply potential EXTVDD and a node W51 and receives a precharge signal PC at its gate. Capacitor C2 is connected between node W51 and ground node. N-channel MOS transistor N3D1 is connected between node W51 and ground node and receives a potential VBD1 at its gate.

Preprocessing circuit 62 further includes a P-channel MOS transistor P20, a capacitor C3, and an N-channel MOS transistor N3D2. P-channel MOS transistor P20 is connected between the node receiving power supply potential EXTVDD and a node W52 and receives a precharge signal PC at its gate. Capacitor C3 is connected between node W52 and ground node. N-channel MOS transistor N3D2 is connected between node W52 and ground node and receives a potential VBD2 at its gate.

Preprocessing circuit 62 further includes three N-channel MOS transistors N15 and comparators CP0, CP1, CP2. N-channel MOS transistors N15 couple nodes W50, W51, W52 to the ground potential according to a data reset signal DRST, respectively. Comparator CP0 has its negative input node connected to node W50, and receives reference potential VREF2 at its positive input node and outputs a signal CPO0. Comparator CP1 has its negative input node connected to node W51, and receives reference potential VREF2 at its positive input node and outputs a signal CPO1. Comparator CPO2 has its negative input node connected to node W52, and receives reference potential VREF2 at its positive input node and outputs a signal CPO2. Comparators CP0 to CP2 are activated in response to activation signal SUP2.

Figure 7:
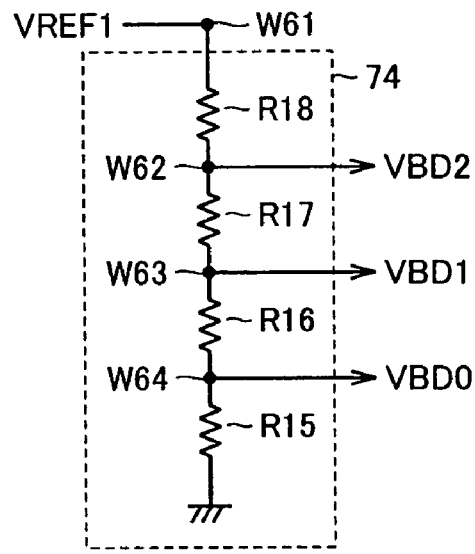
FIG. 7 is a circuit diagram showing an example of the structure of a level converter 74 in FIG. 6.

FIG. 7 is a circuit diagram showing an example of the structure of level converter 74 in FIG. 6.

Referring to FIG. 7, level converter 74 includes resistors R15, R16, R17, R18. Resistor R18 is connected between a node W61 receiving reference potential VREF1 and a node W62 outputting potential VBD2. Resistor R17 is connected between node W62 and a node W63 outputting potential VBD1. Resistor R16 is connected between node W63 and a node W64 outputting potential VBD0. Resistor R15 is connected between node W64 and ground node. Resistors R15, R16, R17, R18 are preferably formed from the same material so that they are not affected by variation and temperature.

Figure 8:
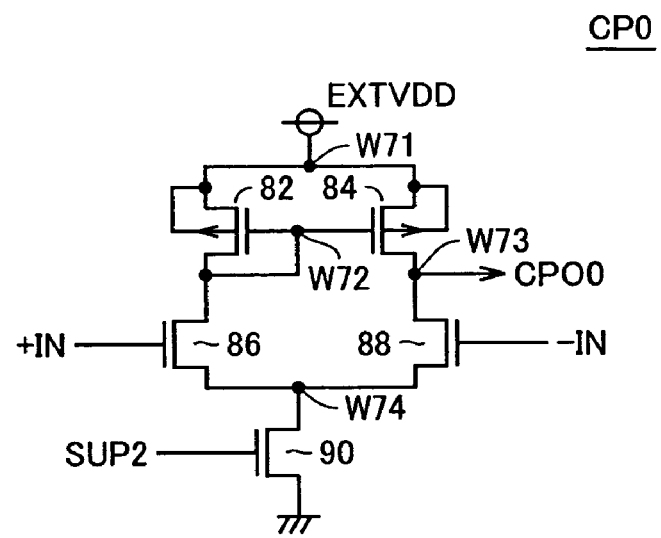
FIG. 8 is a circuit diagram showing the structure of a comparator CP0 in FIG. 6.

FIG. 8 is a circuit diagram showing the structure of comparator CP0 in FIG. 6.

Referring to FIG. 8, comparator CP0 includes P-channel MOS transistors 82, 84 and N-channel MOS transistors 86, 88, 90. P-channel MOS transistor 82 has its source and back gate connected to a node W71 receiving a power supply potential EXTVDD, and its gate and drain connected to a node W72. N-channel MOS transistor 86 is connected between nodes W72, W74 and has its gate connected to an input node +IN. P-channel MOS transistor 84 has its source and back gate connected to node W71, its gate connected to node W72, and its drain connected to a node W73. N-channel MOS transistor 88 is connected between nodes W73, W74 and has its gate connected to an input node –IN. N-channel MOS transistor 90 is connected between node W74 and ground node, and receives an activation signal SUP2 at its gate. Node W73 serves as an output node of the comparator, and a signal CPO0 is output from node W73.

Comparators CP1, CP2 of FIG. 6 have the same structure as that of comparator CP0 of FIG. 8 except that signals CPO1, CPO2 are output instead of signal CPO0, respectively. Therefore, description thereof will not be repeated.

Figure 9:
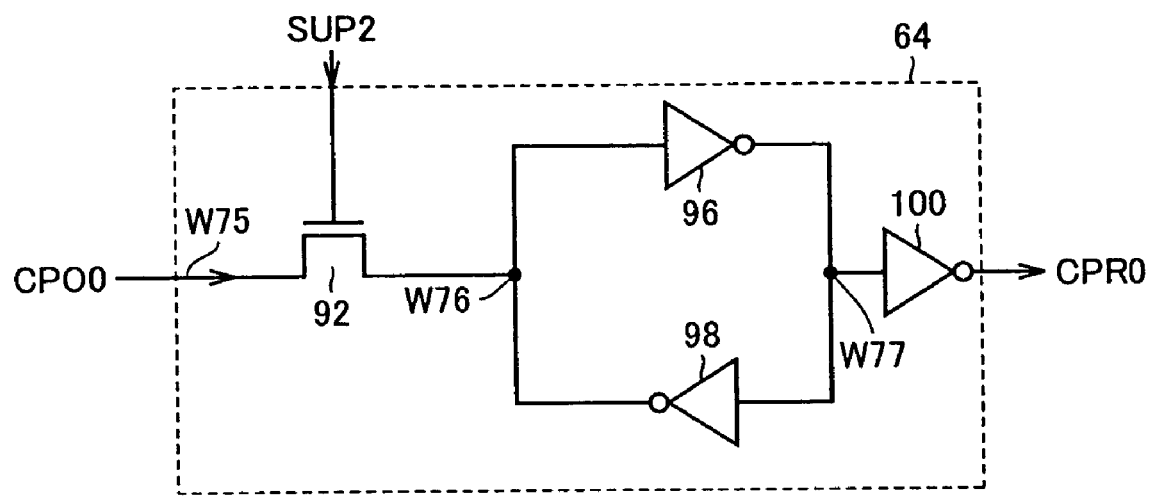
FIG. 9 is a circuit diagram showing the structure of a register 64 in FIG. 6.

FIG. 9 is a circuit diagram showing the structure of register 64 in FIG. 6.

Referring to FIG. 9, resistor 64 includes an N-channel MOS transistor 92 and inverters 96, 98, 100. N-channel MOS transistor 92 is connected between a node W75 receiving signal CPO0 and a node W76, and receives activation signal SUP2 at its gate. Inverter 96 has its input connected to node W76 and its output connected to a node W77. Inverter 98 has its input connected to node W77 and its output connected to node W76. Inverter 100 has its input connected to node W77 and outputs signal CPR0.

Since registers 66, 68 of FIG. 6 have the same structure as that of register 64 except their labels of input and output signals, description thereof will not be repeated.

Hereinafter, operation and structure of logic circuit 70 in FIG. 6 will be described.

FIG. 10 is a truth table showing input/output values of logic circuit 70.

Referring to FIG. 10, logic circuit 70 receives (CPR2, CPR1, CPR0) and outputs (VBC2, VBC1, VBC0, ROU, ROL, FAIL).

When logic circuit 70 receives (000), it outputs (001100). Similarly, the relation between input and output of logic circuit 70 is as follows:

When logic circuit 70 receives (001), it outputs (001000);

When logic circuit 70 receives (010), it outputs (XXXXX1);

When logic circuit 70 receives (011), it outputs (XXXXX1);

When logic circuit 70 receives (100), it outputs (100000);

When logic circuit 70 receives (101), it outputs (XXXXX1);

When logic circuit 70 receives (110), it outputs (010000); and

When logic circuit 70 receives (111), it outputs (100010).

Logic circuit 70 may have any structure as long as it satisfies this truth table.

The truth table of logic circuit 70 is given by the following logical expressions:

$$VBC0 = \overline{CPR1} \cdot \overline{CPR2}$$

$$VBC1 = \overline{CPR0} \cdot \overline{CPR1} \cdot CPR2$$

$$VBC2 = (\overline{CPR0} \cdot \overline{CPR1} + CPR0 \cdot CPR1) \cdot CPR2$$

$$ROU = \overline{CPR0} \cdot \overline{CPR1} \cdot \overline{CPR2}$$

$$ROL = CPR0 \cdot CPR1 \cdot \overline{CPR2}$$

$$FAIL = \overline{CPR2} \cdot \overline{CPR1} + CPR0 \cdot \overline{CPR1} \cdot CPR2$$

Figure 11:
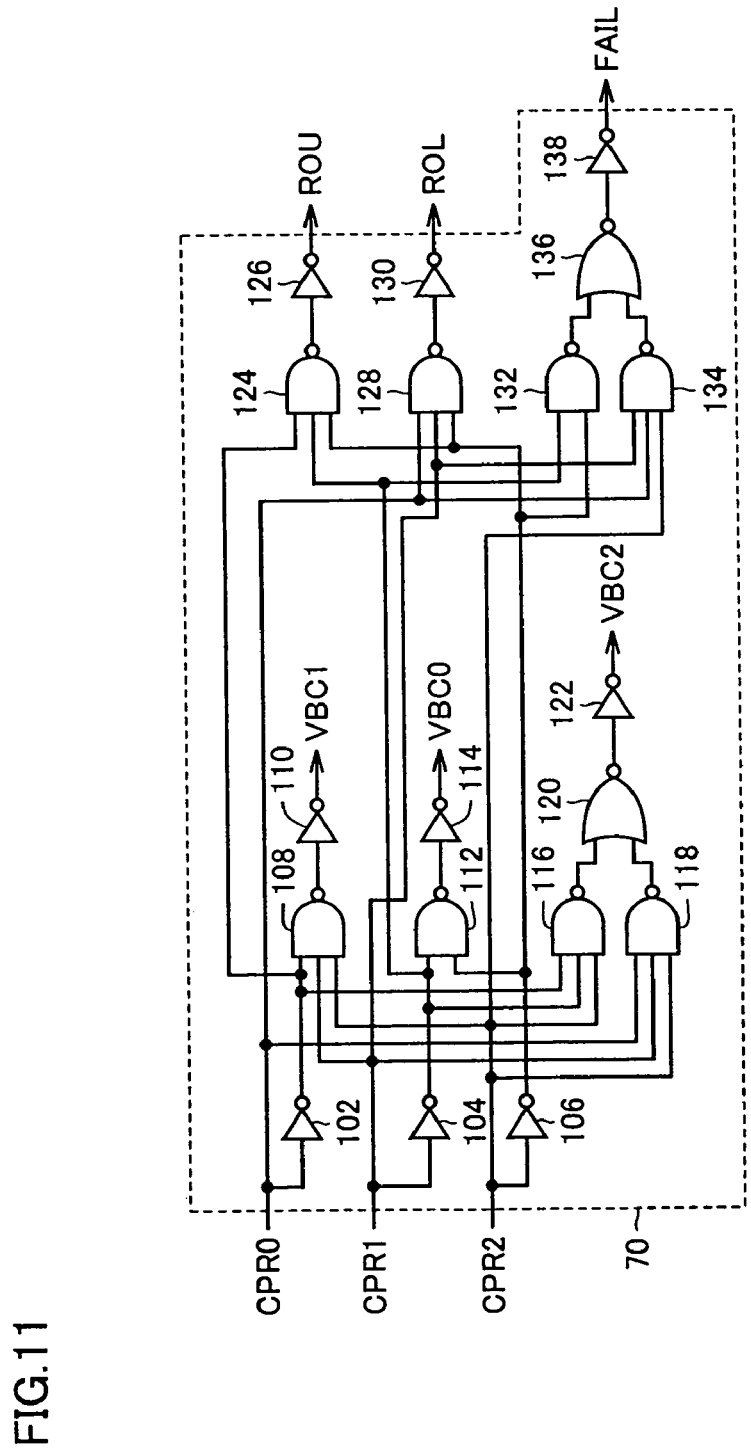
FIG. 11 is a circuit diagram showing an example of the structure of logic circuit 70 that satisfies the truth table in FIG. 10.

FIG. 11 is a circuit diagram showing an example of the structure of logic circuit 70 that satisfies the truth table of FIG. 10.

Referring to FIG. 11, logic circuit 70 includes inverters 102, 104, 106, a three-input NAND circuit 108, an inverter 110, a NAND circuit 112 and an inverter 114. Inverters 102, 104, 106 invert signals CPR0, CPR1, CPR2, respectively. Three-input NAND circuit 108 receives the output of inverter 102 and signals CPR1, CPR2. Inverter 110 inverts the output of NAND circuit 108 and outputs a signal VBC1. NAND circuit 112 receives the output of inverter 104 and the output of inverter 106. Inverter 114 inverts the output of NAND circuit 112 and outputs a signal VBC0.

Logic circuit 70 further includes three-input NAND circuits 116, 118, a NOR circuit 120 and an inverter 122. Three-input NAND circuit 116 receives the respective outputs of inverters 102, 104 and signal CPR2. Three-input NAND circuit 118 receives signals CPR0, CPR1, CPR2. NOR circuit 120 receives the respective outputs of NAND circuits 116, 118. Inverter 122 inverts the output of NOR circuit 120 and outputs a signal VBC2.

Logic circuit 70 further includes a three-input NAND circuit 124, an

Logic circuit 70 further includes a three-input NAND circuit 124, an inverter 126, a three-input NAND circuit 128, an inverter 130, a NAND circuit 132, a three-input NAND circuit 134, a NOR circuit 136 and an inverter 138. Three-input NAND circuit 124 receives the respective outputs of inverters 102, 104, 106. Inverter 126 inverts the output of NAND circuit 124 and outputs a signal ROU. Three-input NAND circuit 128 receives signals CPR0, CPR1 and the output of inverter 106. Inverter 130 inverts the output of NAND circuit 128 and outputs a signal ROL. NAND circuit 132 receives the respective outputs of inverters 104, 106. Three-input NAND circuit 134 receives signals CPR0, CPR1, CPR2. NOR circuit 136 receives the respective outputs of NAND circuits 132, 134. Inverter 138 inverts the output of NOR circuit 136 and outputs a failure signal FAIL.

Hereinafter, operation of selecting bias potential VBIAS will be described with reference to FIGS. 5 and 6. The fourth embodiment is characterized by transistors N3D0 to N3D2. Transistors N3D0 to N3D2 are replica transistors designed to have the same size and characteristics as those of N-channel MOS transistor N3 in down-converting portion 36 of FIG. 5. Transistors N3D0 to N3D2 are provided close to N-channel MOS transistor N3 as much as possible.

Comparators CP0 to CP2 compare the potentials on nodes W50, W51, W52 with reference potential VREF2, respectively. Nodes W50, W51, W52 are first precharged and then discharged by transistors N3D0 to N3D2, respectively.

Figure 12:
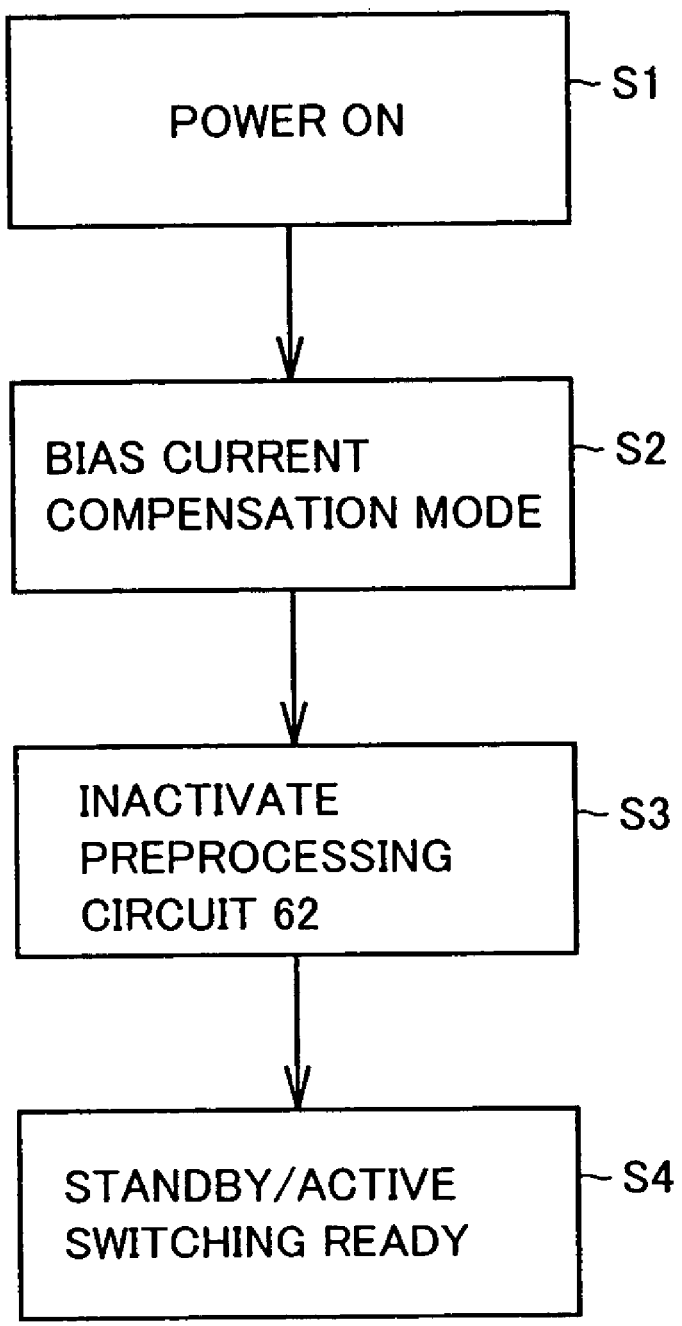
FIG. 12 is a flowchart showing an execution sequence according to the fourth embodiment.

FIG. 12 is a flowchart illustrating an execution sequence in the fourth embodiment.

Referring to FIGS. 6 and 12, power is turned ON in step S1. In step S2, operation mode is set to a bias current compensation mode, and threshold voltage Vth of N-channel MOS transistor N3 is monitored by using replica transistors N3D0 to N3D2. The monitoring result is latched in registers 64, 66, 68.

In step S3, preprocessing circuit 62 is turned OFF for power saving. The level of output VBIAS of reference potential generator 32C is controlled based on the monitoring result latched in registers 64 to 68.

In step S4, switching between standby/active states becomes ready.

Figure 13:
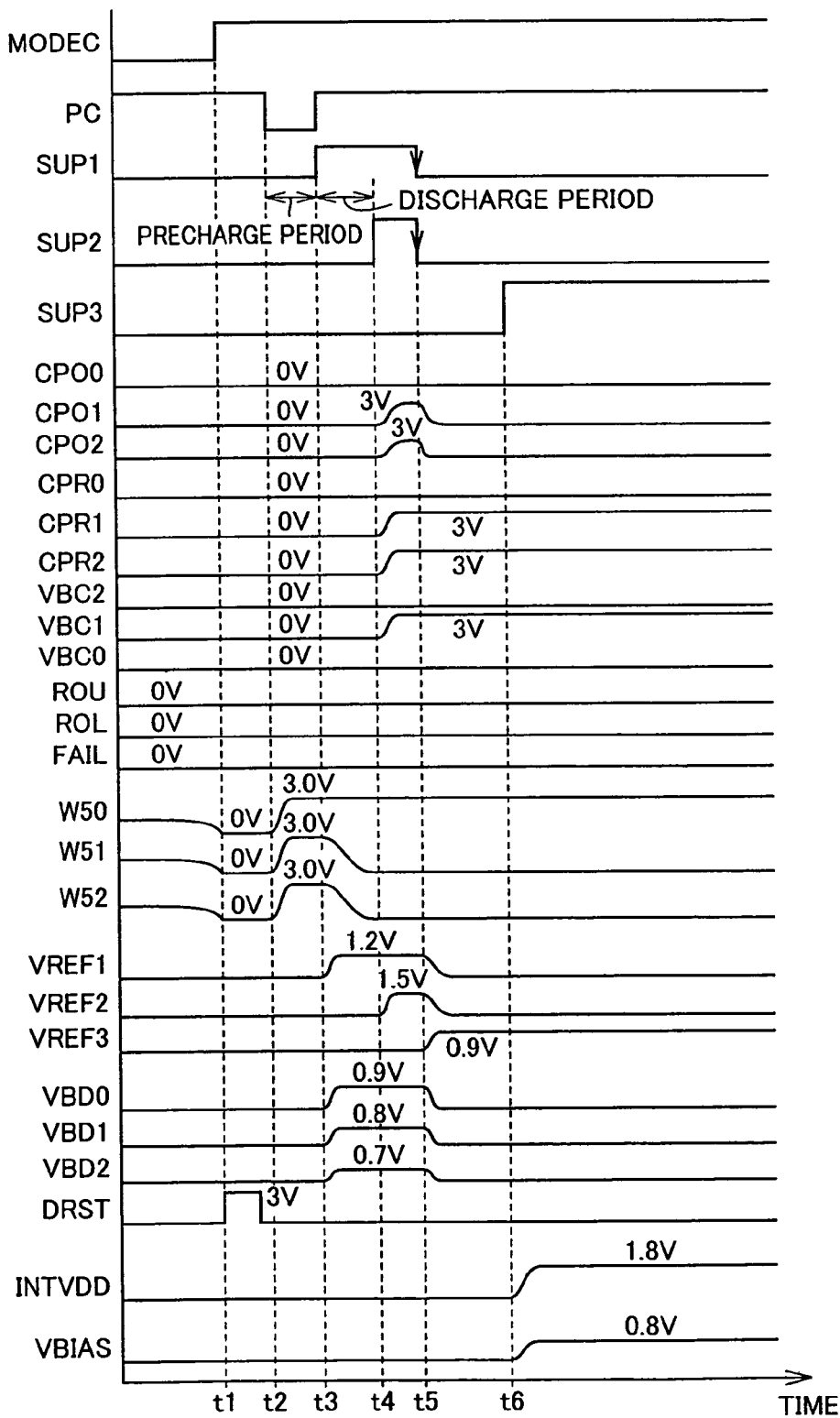
FIG. 13 is a waveform chart illustrating operation of the fourth embodiment.

FIG. 13 is a waveform chart illustrating operation of the fourth embodiment.

Referring to FIGS. 5 and 13, a mode signal MODEC rises to H level at time t1. In response to this, control circuit 50 conducts prescribed operation.

A data reset signal DRST rises to H level in the period between t1 and t2. In response to this, N-channel MOS transistor N15 in FIG. 6 is turned ON, and nodes W50, W51, W52 are coupled to the ground potential.

A precharge signal PC is set to L level at time t2. In response to this, transistors P18, P19, P20 are turned ON, and nodes W50, W51, W52 are precharged to power supply potential EXTVDD. It is herein assumed that power supply potential EXTVDD is 3 V.

At time t3, an activation signal SUP1 is set to H level and precharge signal PC is set to H level. In other words, the period between time t2 and t3 is set as a precharge period. When activation signal SUP1 rises to H level, reference potential generator 72 is activated and generates a reference potential VREF1 (1.2 V). Level converter 74 generates potentials VBD0 (0.9 V), VBD1 (0.8 V), VBD2 (0.7 V) based on reference potential VREF1. The respective resistance values of resistors R15 to R18 in FIG. 7 are determined so that such potentials are output.

The period between t3 and t4 is set as a discharge period. Of replica transistors N3D0 to N3D2 respectively receiving potentials VBD0 to VBD2, a transistor having its gate potential exceeding the threshold voltage is turned ON. Of nodes W50 to W52, a node connected to the turned-ON transistor is discharged.

An activation signal SUP2 goes to H level at time t4. In response to this, reference potential generator 76 is activated and generates a reference potential VREF2 (1.5 V). At the same time, comparators CP0, CP1, CP2 are activated and compare the potentials on nodes W50, W51, W52 with reference potential VREF2, respectively. The output of a comparator connected to a node discharged to reference potential VREF2 or less goes to H level.

FIG. 13 illustrates the case where threshold voltage Vthn is monitored as 0.8 V.

In this case, nodes W51, W52 are discharged and node W50 is held in the precharged state. Accordingly, output signals CPO1, CPO2 of comparators CP1, CP2 go to H level. Signals CPO0, CPO1, CPO2 are applied to registers 64, 66, 68 in FIG. 6, respectively. Signals CPR0 to CPR2 vary in the same manner as that of signals CPO0 to CPO2, respectively.

At time t5, activation signals SUP1, SUP2 are set to L level, and preprocessing circuit 62 is turned OFF. Since the N-channel MOS transistors respectively provided in the input portions of registers 64, 66, 68 are turned OFF, signals CPR0 to CPR2 are retained in the latched state and therefore will not be destroyed.

Logic circuit 70 outputs signals VBC0 to VBC2, ROU, ROL, FAIL based on signals CPR0 to CPR2, according to the truth table of FIG. 10. Signal ROU is an over range upper signal, and is activated when no comparator outputs H level. In this case, signal VBC0 is set to H level so that bias potential VBIAS is maximized. Signal ROL is an over range under signal, and is activated when every comparator outputs H level. In this case, signal VBC2 is set to H level so that bias potential VBIAS is minimized.

Failure signal FAIL is a signal that is activated when the situation that could not occur if the mode works normally occurs, such as when signals CPR1, CPR2 are both at L level as well as signal CPR0 is at H level. After the system is reset in response to signal FAIL, the bias current compensation mode is executed again.

When signal FAIL goes to H level, transistor N25 in FIG. 5 is turned ON and bias potential VBIAS falls to the ground potential.

It is herein assumed that signals CPR1, CPR2 are both at H level and signal CPR0 is at L level. Therefore, signals ROU, ROL, FAIL are not activated. In this case, signal VBC1 goes to H level and transistor N23 is turned ON.

At time t6, an activation signal SUP3 is set to H level and reference potential generator 32C is activated. Reference potential generator 32C is essentially the same as reference potential generator 34 in FIG. 2 except that a selector is added to the output portion.

Moreover, reference potential generator 34 is activated and generates a reference potential VREF3 (0.9 V).

Depending on which of signals VBC0 to VBC2 goes to H level, the output resistance ratio of reference potential generator 32C is selected and the level of bias potential VBIAS is changed. For simplicity, it is herein assumed that bias potential VBIAS is adjusted to the same level as that of one of potentials VBD0 to VBD2 output from level converter 74 in FIG. 6.

Provided that N-channel MOS transistor N23 is turned ON at time t6, bias potential VBIAS is set to 0.8 V. If threshold voltage Vthn is monitored as 0.1 V lower than that in the above case, signal CPR2 in FIG. 6 goes to H level and signals CPR0, CPR1 go to L level. Therefore, signal VBC2 goes to H level and N-channel MOS transistor N24 is turned ON. As a result, bias potential VBIAS of 0.7 V is generated.

On the other hand, if threshold voltage Vthn is monitored as 0.1 V higher than that in the above case, signals CPR0 to CPR2 go to L level. Therefore, signal VBC0 goes to H level and N-channel MOS transistor N24 is turned ON. As a result, bias potential VBIAS of 0.9 V is generated.

Since level converter 74 in FIG. 6 has only three outputs, it cannot be known whether threshold voltage Vthn is increased by 0.1 V or 0.2 V. However, this is solved by using level converter 74 having an increased number of outputs and providing the structure corresponding such a level converter 74. In short, the level of bias potential VBIAS can be changed according to variation in threshold voltage Vthn.

In the fourth embodiment, bias potential VBIAS is adjusted to the same level as that of one of potentials VBD0 to VBD2. However, the present invention is not limited to this, and bias potential VBIAS may be adjusted to a level that is offset with respect to potential VBD0 to VBD2 or may be adjusted to a level of potential VBD0 to VBD2 multiplied by a prescribed factor. Moreover, although the precharge level is herein a power supply potential EXTVDD, the present invention is not limited to this, and any intermediate potential may alternatively be used.

Since an appropriate bias potential VBIAS is generated and a bias current Ibias that is not affected by threshold voltage Vthn flows through differential amplifier 40 of down-converting portion 36, power supply potential INTVDD of 1.8 V is obtained. In this case, the resistance ratio R6/R5=1.

Fifth Embodiment

The fourth embodiment requires a plurality of replica transistors. As a result, the area is increased. Moreover, mismatching between transistor N3 and replica transistors may possibly occur.

These problems are solved by using only one replica transistor and monitoring threshold voltage Vthn in a time-series manner.

Figure 14:
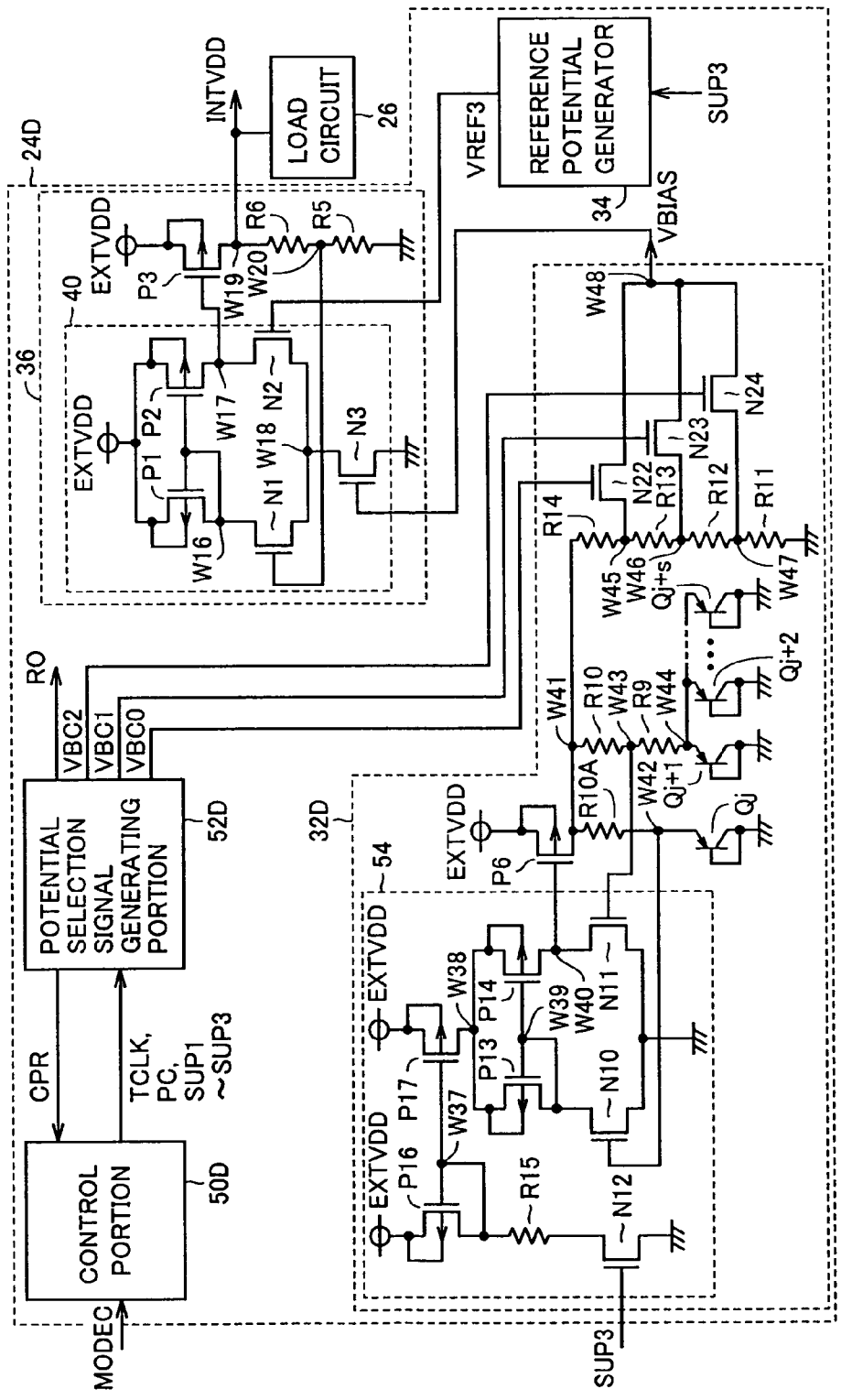
FIG. 14 is a circuit diagram showing the structure of a voltage down-converter 24D according to a fifth embodiment of the present invention.

FIG. 14 is a circuit diagram showing the structure of a voltage down-converter 24D according to the fifth embodiment of the present invention.

Referring to FIG. 14, voltage down-converter 24D includes a control portion 50D, a potential selection signal generating portion 52D, a reference potential generator 32D, a reference potential generator 34, and a down-converting portion 36. Control portion 50D outputs signals TCLK, PC, SUP1 to SUP3 in response to a mode signal MODEC. Potential selection signal generating portion 52D receives the output of control portion 50D and outputs selection signals VBC0 to VBC2 and a signal RO. Potential selection signal generating portion 52D also outputs a signal CPR to control portion 50D. Reference potential generator 32D is activated in response to signal SUP3, and outputs a bias potential VBIAS according to selection signals VBC0 to VBC2. Reference potential generator 34 is activated in response to signal SUP3 and outputs a reference potential VREF3. Down-converting portion 36 down-converts power supply potential EXTVDD according to reference potential VREF3 and bias potential VBIAS and outputs a power supply potential INTVDD.

In the structure of FIG. 14 as well, potential selection signal generating portion 52D and reference potential generator 32D form a compensating circuit equivalent to threshold voltage compensating circuit 32 in FIG. 1, as in the case of FIG. 5.

Since down-converting portion 36 has the same structure as that of down-converting portion 36 in FIG. 2, description thereof will not be repeated. Since reference potential generator 34 has the same structure as that of reference potential generator 34 in FIG. 2, description thereof will not be repeated. Reference potential generator 32D has the same structure as that of reference potential generator 32C in FIG. 5 except that transistor N25 is eliminated. Therefore, description thereof will not be repeated.

Figure 15:
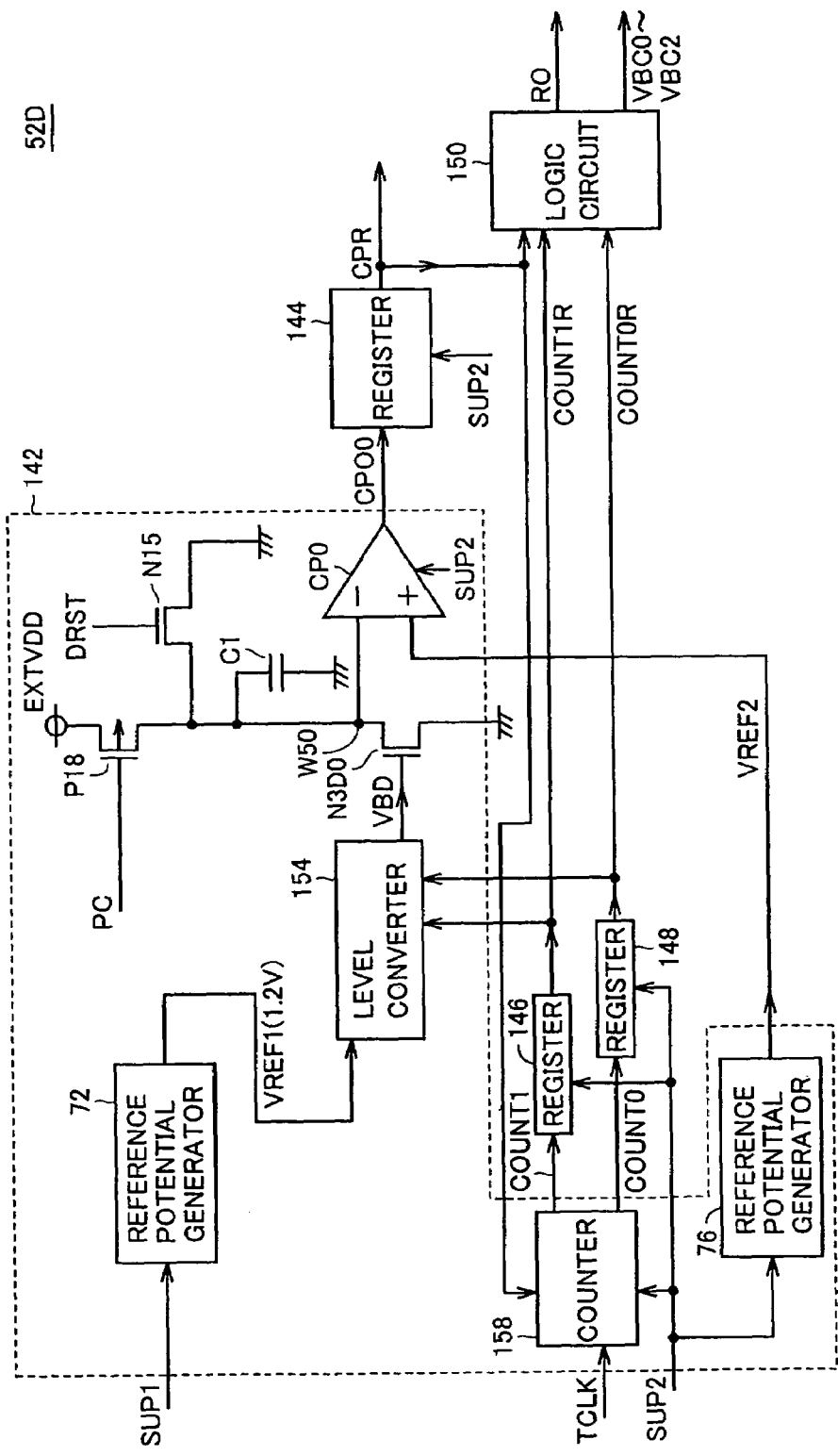
FIG. 15 is a circuit diagram showing the structure of a reference selection signal generating portion 52D in FIG. 14.

FIG. 15 is a circuit diagram showing the structure of potential selection signal generating portion 52D in FIG. 14.

Referring to FIG. 15, potential selection signal generating portion 52D includes a preprocessing circuit 142, registers 144, 146, 148 and a logic circuit 150. Preprocessing circuit 142 operates for a prescribed period after power is turned ON. Preprocessing circuit 142 conducts monitoring operation for compensating for a bias potential VBIAS. Registers 144, 146, 148 hold output signals CPO0, COUNT1, COUNT0 of preprocessing circuit 142, respectively. Logic circuit 150 receives output signals CPR, COUNT1R, COUNT0R of registers 144, 146, 148 and outputs selection signals VBC0 to VBC2 and a signal RO.

Preprocessing circuit 142 is different from preprocessing circuit 62 in FIG. 6 in that the number of replica transistors and the number of comparators are each reduced to one for successive comparison.

More specifically, preprocessing circuit 142 includes a reference potential generator 72, a level converter 154, a counter 158 and a reference potential generator 76. Reference potential generator 72 is activated in response to activation signal SUP1 and outputs a reference potential VREF1 (e.g., 1.2 V). Level converter 154 converts the level of reference potential VREF1 and outputs a potential VBD. Counter 158 changes a count value in response to signal TCLK. Reference potential generator 76 is activated in response to activation signal SUP2 and outputs a reference potential VREF2.

Preprocessing circuit 142 further includes a P-channel MOS transistor P18, a capacitor C1, an N-channel MOS transistor N15, an N-channel MOS transistor N3D0, and a comparator CP0. P-channel MOS transistor P18 is connected between a node receiving power supply potential EXTVDD and a node W50 and receives a precharge signal PC at its gate. Capacitor C1 is connected between node W50 and ground node. N-channel MOS transistor N15 is connected between node W50 and ground node and receives a data reset signal DRST at its gate. N-channel MOS transistor N3D0 is connected between node W50 and ground node and receives a potential VBD at its gate. Comparator CP0 is activated in response to activation signal SUP2, and compares a potential on node W50 with reference potential VREF and outputs a signal CPO0.

N-channel MOS transistor N3D0 is a replica transistor of N-channel MOS transistor N3 serving as a current source in down-converting portion 36 of FIG. 14. Accordingly, N-channel MOS transistors N3D0, N3 are provided close to each other, and have the same size so as to have the same characteristics.

Figure 16:
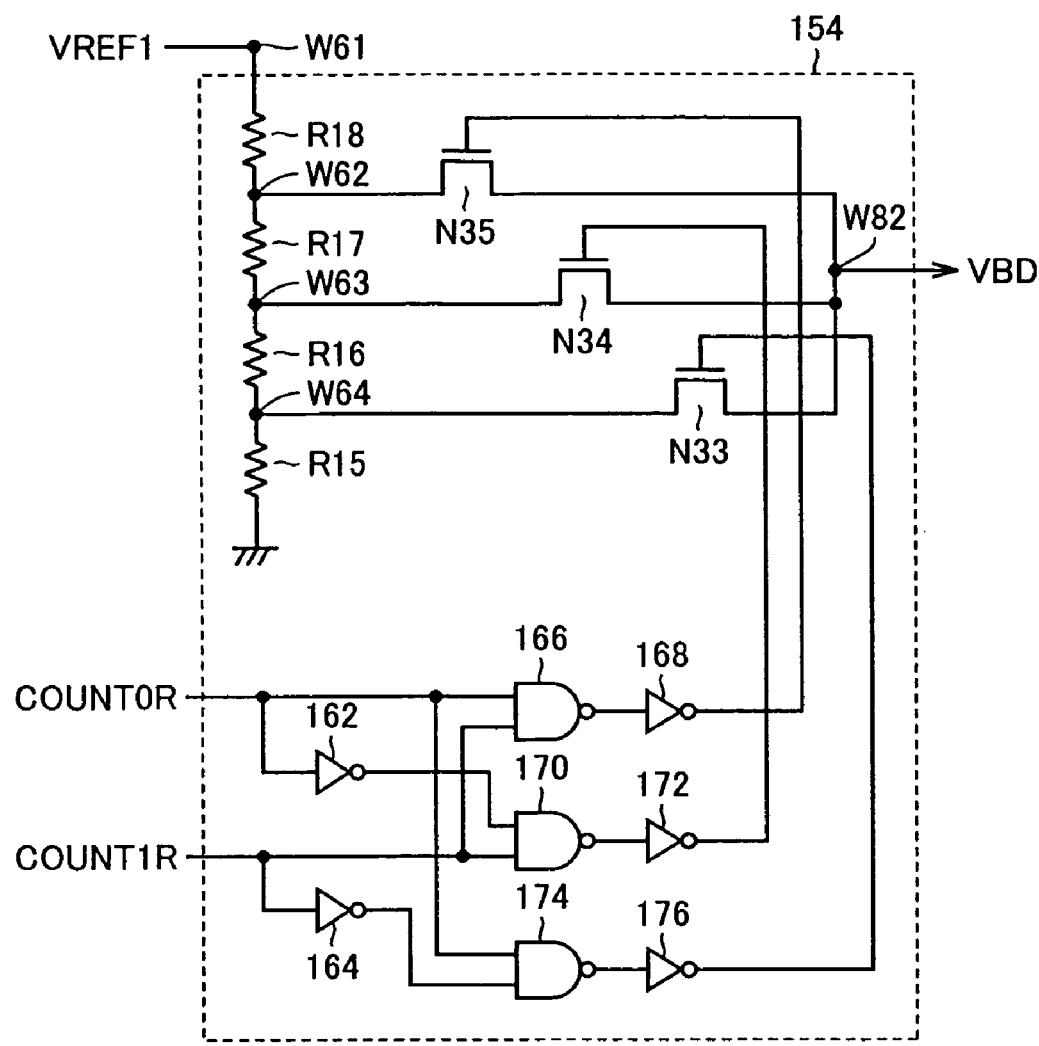
FIG. 16 is a circuit diagram showing the structure of a level converter 154 in FIG. 15.

FIG. 16 is a circuit diagram showing the structure of level converter 154 in FIG. 15.

Referring to FIG. 16, level converter 154 selects an output potential of level converter 74 in FIG. 7 according to signals COUNT0R, COUNT1R for output.

More specifically, level converter 154 includes a resistor R18 connected between nodes W61, W62, a resistor R17 connected between nodes W62, W63, a resistor R16 connected between nodes W63, W64, and a resistor R15 connected between node W64 and ground node. Resistors R15, R16, R17, R18 are preferably formed from the same material so that they are not affected by variation and temperature.

Level converter 154 further includes inverters 162, 164, a NAND circuit 166, an inverter 168, a NAND circuit 170, an inverter 172, a NAND circuit 174 and an inverter 176. Inverters 162, 164 invert signals COUNT0R, COUNT1R, respectively. NAND circuit 166 receives signals COUNT0R, COUNT1R. Inverter 168 inverts the output of NAND circuit 166. NAND circuit 170 receives the output of inverter 162 and signal COUNT1R. Inverter 172 inverts the output of NAND circuit 170. NAND circuit 174 receives signal COUNT0R and the output of inverter 164. Inverter 176 inverts the output of NAND circuit 174.

Level converter 154 further includes N-channel MOS transistors N33, N34, N35. N-channel MOS transistor N35 is connected between nodes W62, W82 and receives the output of inverter 168 at its gate. N-channel MOS transistor N34 is connected between nodes W63, W82 and receives the output of inverter 172 at its gate. N-channel MOS transistor N33 is connected between nodes W64, W82 and receives the output of inverter 176 at its gate. A potential VBD is output from node W82.

Figures 17, 18:
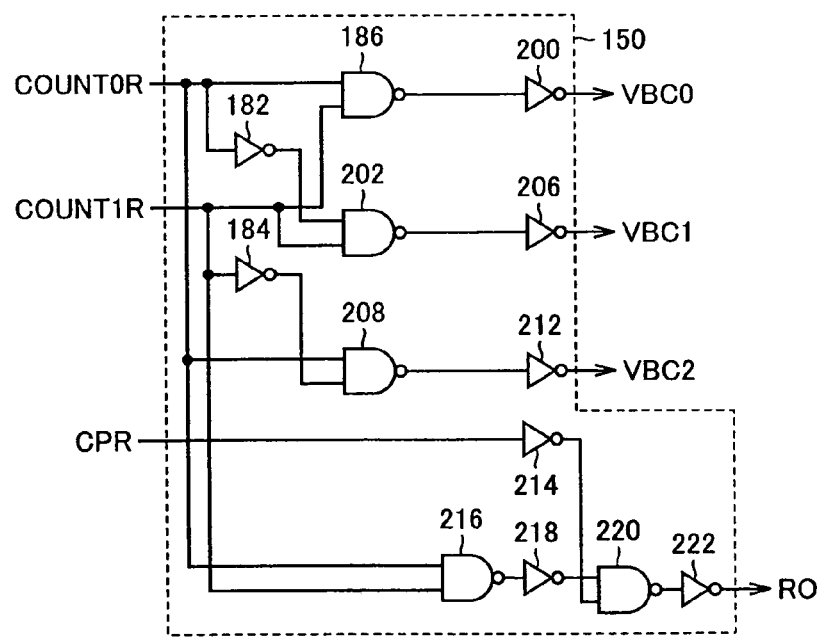
FIG. 17 is a truth table showing input/output values of a logic circuit 150 in FIG. 15.
FIG. 18 is a circuit diagram showing an example of the structure of logic circuit 150.

FIG. 17 is a truth table showing input/output values of logic circuit 150 in FIG. 15.

Referring to FIG. 17, logic circuit 150 receives (COUNT1R, COUNT0R, CPR) and outputs (VBC0, VBC1, VBC2, RO). The relation between input and output of logic circuit 150 is as follows:

When logic circuit 150 receives (000), it outputs (0000);
When logic circuit 150 receives (001), it outputs (0000);
When logic circuit 150 receives (010), it outputs (0010);
When logic circuit 150 receives (011), it outputs (0010);
When logic circuit 150 receives (100), it outputs (0100);
When logic circuit 150 receives (101), it outputs (0100);
When logic circuit 150 receives (110), it outputs (1001); and
When logic circuit 150 receives (111), it outputs (1000).

FIG. 18 is a circuit diagram showing an example of the structure of logic circuit 150.

Referring to FIG. 18, logic circuit 150 includes inverters 182, 184 for inverting signals COUNT0R, COUNT1R, respectively, a NAND circuit 186 receiving signals COUNT0R, COUNT1R, and an inverter 200 for inverting the output of NAND circuit 186 and outputting a signal VBC0.

Logic circuit 150 further includes a NAND circuit 202 receiving the output of inverter 182 and signal COUNT1R, and an inverter 206 for inverting the output of NAND circuit 202 and outputting a signal VBC1.

Logic circuit 150 further includes a NAND circuit 208 receiving the output of inverter 184 and signal COUNT0R, and an inverter 212 for inverting the output of NAND circuit 208 and outputting a signal VBC2.

Logic circuit 150 further includes an inverter 214 for inverting signal CPR, a NAND circuit 216 receiving signals COUNT0R, COUNT1R, an inverter 218 for inverting the output of NAND circuit 216, a NAND circuit 220 receiving the respective outputs of inverters 214, 218, and an inverter 222 for inverting the output of NAND circuit 220 and outputting signal RO.

Figure 19:
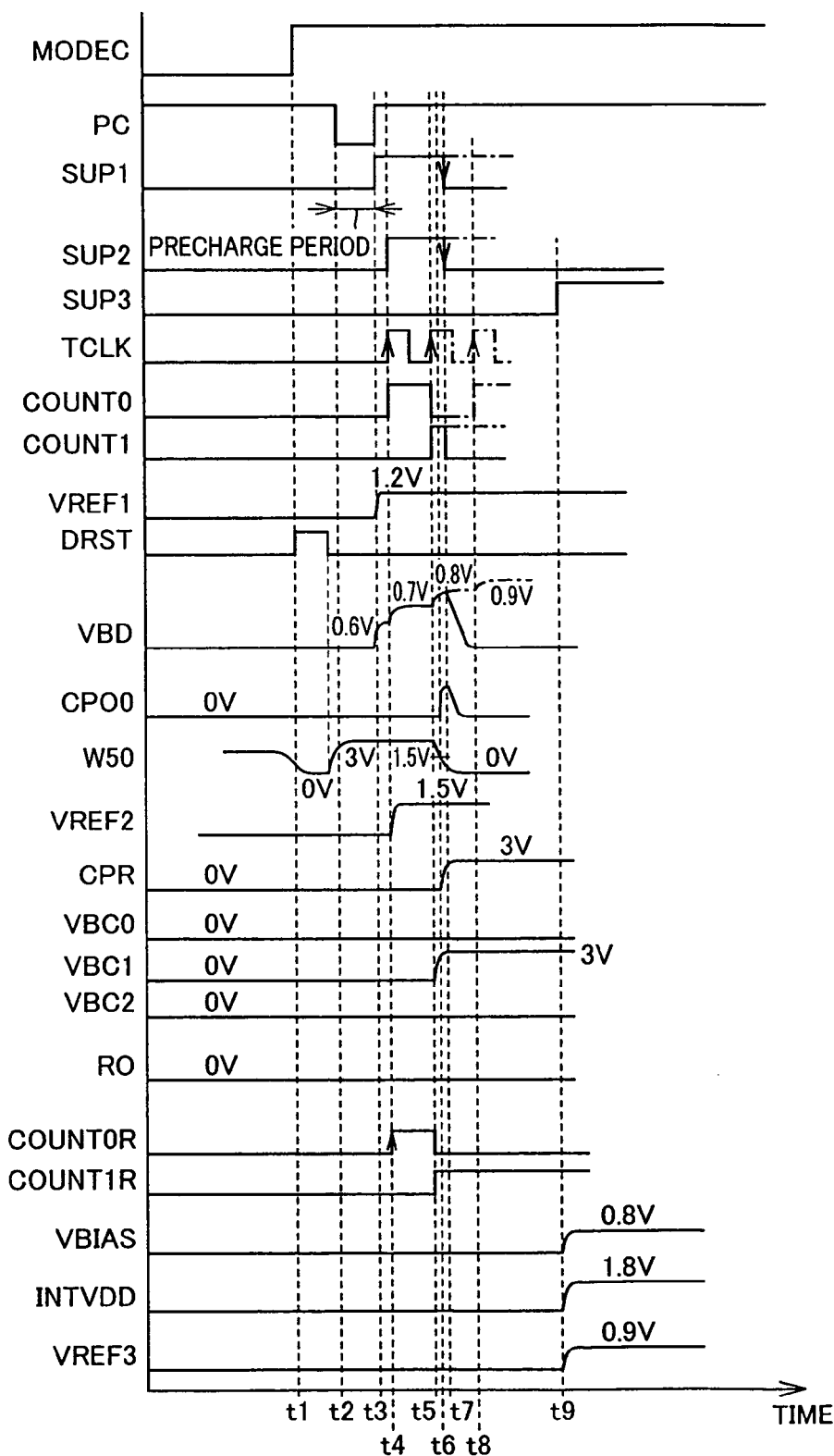
FIG. 19 is a waveform chart illustrating operation of the fifth embodiment.

FIG. 19 is a waveform chart illustrating operation of the fifth embodiment.

Referring to FIGS. 15 and 19, a signal MODEC is set to H level at time t1. In response to this, operation mode is set to a bias current compensation mode. Control circuit 50 in FIG. 5 then conducts prescribed control operation.

A data reset signal DRST is set to H level in the period between t1 and t2. In response to this, transistor N15 is turned ON and node W50 is coupled to the ground potential.

A precharge signal PC is set to L level at time t2. In response to this, transistor P18 is turned ON and node W50 is coupled to power supply potential EXTVDD. It is herein assumed that power supply potential EXTVDD is 3 V.

At time t3, an activation signal SUP1 is activated to H level and precharge signal PC is inactivated to H level. In other words, the period between time t2 and t3 is set as a precharge period.

When activation signal SUP1 is activated to H level, reference potential generator 72 is activated and generates a reference potential VREF1 (1.2 V). Based on reference potential VREF1 and respective output signals COUNT1R, COUNT0R of registers 146, 148, level converter 154 in FIG. 16 successively outputs a potential VBD having a stepped profile.

An activation signal SUP2 is activated to H level at time t4. In response to this, reference potential generator 76 is activated and generates a reference potential VREF2 (1.5 V). At the same time, counter 158, registers 146, 148 and comparator CP0 are activated. Thereafter, a signal TCLK, a periodic timer signal, is generated.

Counter 158 conducts count-up operation at every rising edge of signal TCLK and increments output signals COUNT0, COUNT1, ... Signals COUNT0, COUNT1 are respectively applied to registers 148, 146. Registers 148, 146 outputs the received signals as signals COUNT0R, COUNT1R, respectively.

With change in signals COUNT0R, COUNT1R, potential VBD sequentially varies to 0.7 V, 0.8 V, 0.9 V in a stepwise manner. If potential VBD exceeds threshold voltage Vthn, node W50 is abruptly discharged. As a result, the potential on node W50 becomes equal to or lower than reference potential VREF (1.5 V).

FIG. 19 illustrates the case where threshold voltage Vthn is monitored as 0.8 V. Therefore, signal CPO0 rises to H level at time t6. In response to this, output signal CPR of register 144 rises to H level. Signal CPR is applied to control portion 50D in FIG. 14, and control portion 50D sets activation signals SUP1, SUP2 to L level to inactivate preprocessing circuit 142. Since signals COUNT0, COUNT1, CPR are respectively latched in resisters 148, 146, 144, information of these signals will not be lost. Logic circuit 150 described in connection with FIGS. 17 and 18 outputs signals RO, VCB0 to VCB2 based on signals COUNT0, COUNT1, CPR. Signal RO is a range over signal that is activated if signal CPR does not rise to H level even when the counter finished count-up operation. In FIG. 19, signal COUNT0R is at L level and signals COUNT1R, CPR are both at H level. Therefore, signal VBC1 rises to H level.

At time t9, activation signal SUP3 is set to H level and reference potential generators 34, 32D are activated. Accordingly, a reference potential VREF3 of 0.9 V is generated.

Since signal VBC1 is at H level, transistor N24 in FIG. 14 is turned ON and reference potential generator 32D generates a bias potential VBIAS of 0.8 V.

For simplicity, it is herein assumed that bias potential VBIAS is adjusted to the same level as that of potential VBD of discharged node W50 in FIG. 15.

When threshold voltage Vthn is reduced by 0.1 V, the counter values reduced by one is latched in the respective registers. In this case, signals COUNT0R, COUNT1R, CPR go to H, L, H levels, respectively. Therefore, signal VBC2 goes to H level and transistor N24 in FIG. 14 is turned ON. As a result, a bias potential VBIAS of 0.7 V is generated.

On the other hand, when threshold voltage Vthn is increased by 0.1 V, signals COUNT0R, COUNT1R, CPR go to H level. Therefore, signal VBC0 goes to H level and transistor N22 in FIG. 14 is turned ON. As a result, a bias potential VBIAS of 0.9 V is generated. In FIG. 15, the counter has only a two-bit output. Therefore, it cannot be known whether threshold voltage Vthn is increased by 0.1 V or 0.2 V. However, this is solved by increasing the number of bits. In short, the level of bias potential VBIAS can be changed according to variation in threshold voltage Vthn.

In the fifth embodiment, bias potential VBIAS is adjusted to the same level as that of potential VBD. However, the present invention is not limited to this, and bias potential VBIAS may be adjusted to a level that is offset with respect to potential VBD or may be adjusted to a level of potential VBD multiplied by a prescribed factor. Moreover, although the precharge level is herein a power supply potential EXTVDD, the present invention is not limited to this, and any intermediate potential may alternatively be used.

As has been described above, by using the voltage down-converter of the fifth embodiment, an appropriate bias potential VBIAS is generated and a bias current Ibias that is not affected by threshold voltage Vthn flows through the differential amplifier, whereby power supply potential INTVDD of 1.8 V is obtained. In this case, the resistance ratio R6/R5 is set at 1.

Sixth Embodiment

Figure 20:
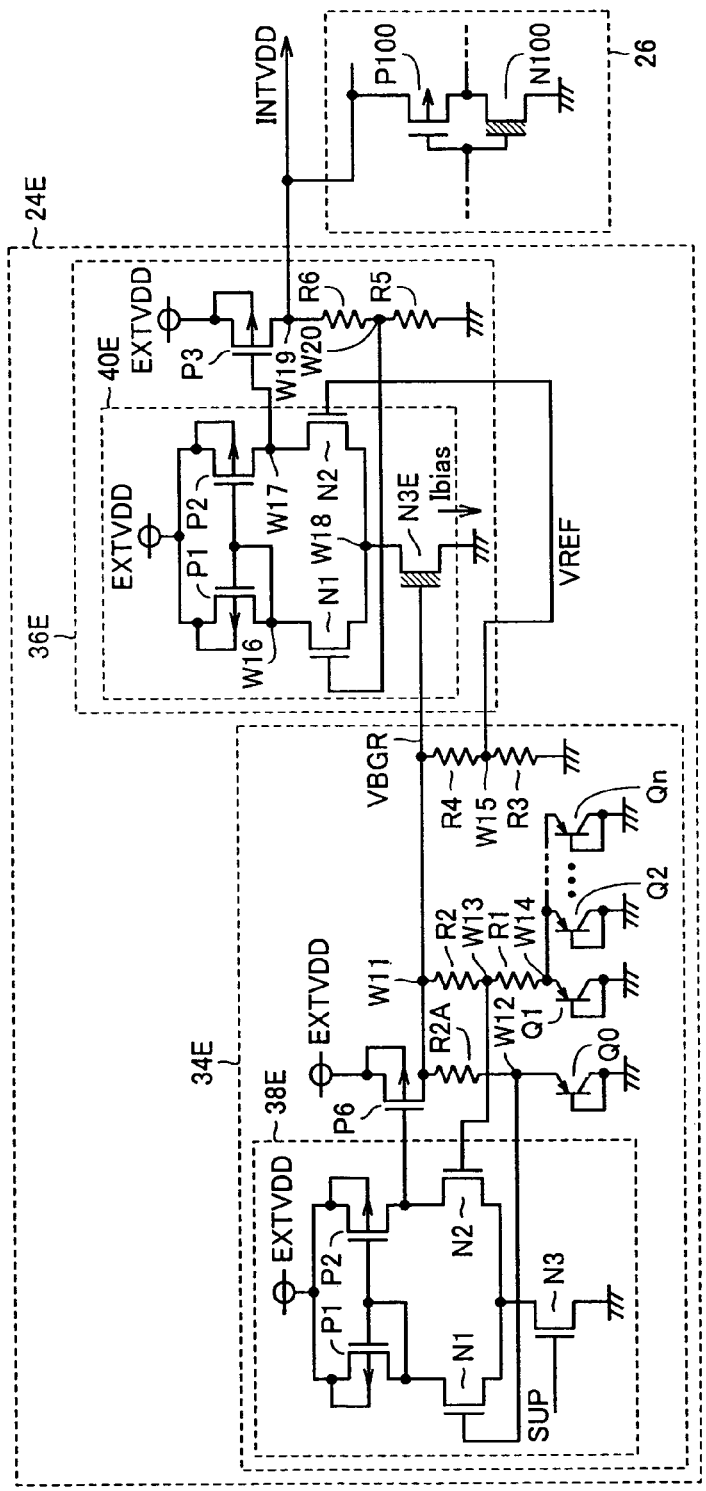
FIG. 20 is a circuit diagram showing the structure of a voltage down-converter 24E according to a sixth embodiment of the present invention.

FIG. 20 is a circuit diagram showing the structure of a voltage down-converter 24E according to the sixth embodiment of the present invention.

Referring to FIG. 20, voltage down-converter 24E includes a reference potential generator 34E for outputting a reference potential VREF and a bias potential VBGR, and a down-converting portion 36E for down-converting a power supply potential EXTVDD according to reference potential VREF and bias potential VBGR and outputting a power supply potential INTVDD.

Reference potential generator 34E is different from reference potential generator 34 in FIG. 2 in that differential amplifier 38 is replaced with a differential amplifier 38E and bias potential VBGR is output from a node W11. Since the structure of reference potential generator 34E is otherwise the same as that of reference potential generator 34, description thereof will not be repeated.

Down-converting portion 36E includes a differential amplifier 40E instead of differential amplifier 40 in down-converting portion 36 in FIG. 2. Differential amplifier 40E is different from differential amplifier 40 in that transistor N3 is replaced with a transistor N3E. Since the structure of down-converting portion 36E is otherwise the same as that of down-converting portion 36 in FIG. 2, description thereof will not be repeated.

Like an N-channel MOS transistor N100 used in a load circuit 26 of an internal power supply potential INTVDD, i.e., a down-converted power supply potential, N-channel MOS transistor N3E is a transistor for low voltage. A transistor for low voltage is a transistor having a thin oxide film and a short minimum gate length, and is often adjusted to have a low threshold voltage so that it can operate at a high speed with a low power supply voltage. In FIG. 20, the load circuit exemplarily includes an inverter formed from P-channel MOS transistor P100 and N-channel MOS transistor N100 as an internal circuit.

Such an internal circuit is driven with a power supply voltage of, e.g., 1.8 V.

Of the N-channel MOS transistors in voltage down-converter 24E, the N-channel MOS transistors excluding transistor N3E are transistors for high voltage of 3.0 V. The transistors for low voltage must be capable of operating with a lower power supply potential than that of the transistors for high voltage of 3 V. Therefore, variation in threshold voltage is more strictly controlled, and an absolute value of variation in threshold voltage of the transistors for low voltage is smaller than that of the transistors for high voltage of 3 V.

Figure 23:
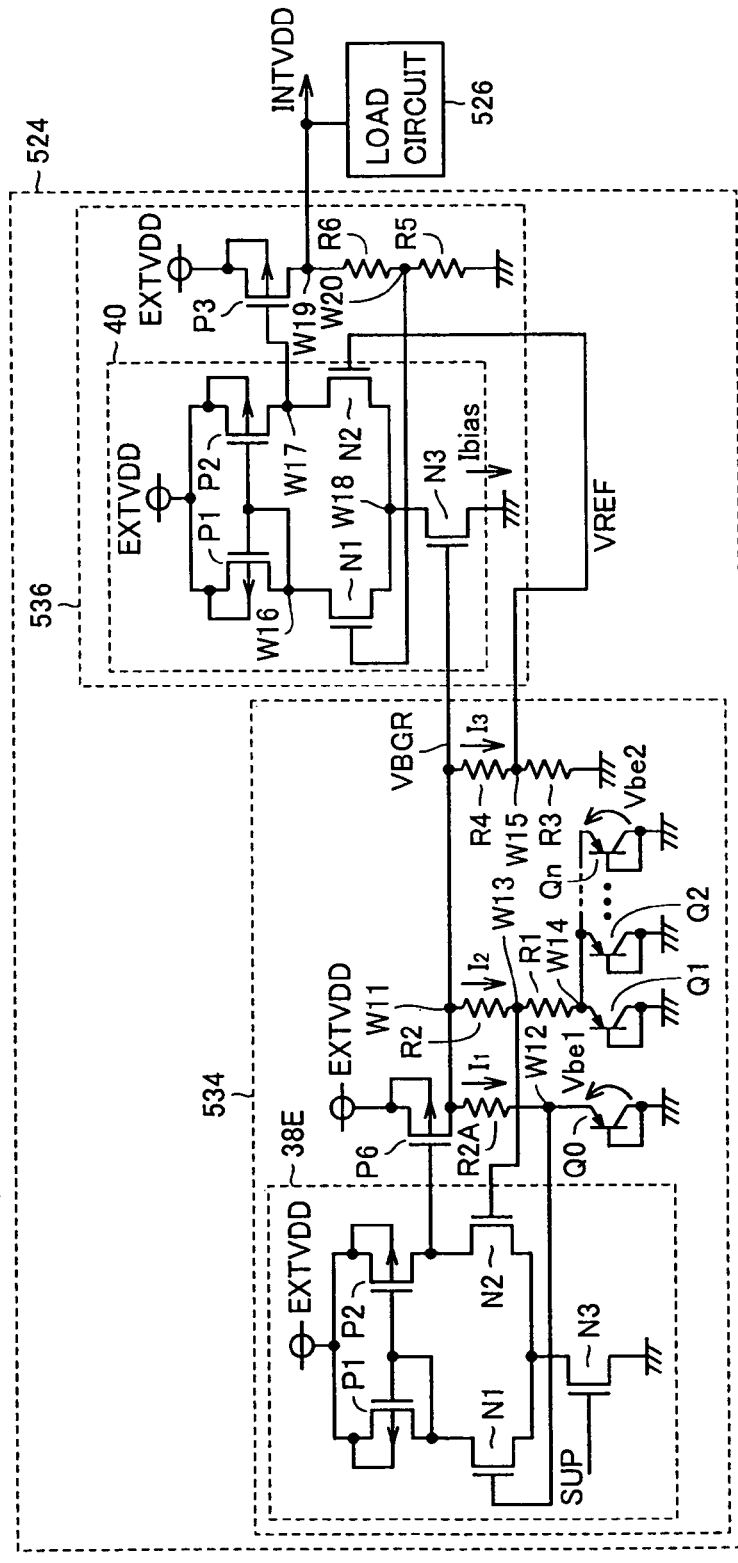
FIG. 23 is a circuit diagram showing the structure of a conventional voltage down-converter 524.
Figure 24:
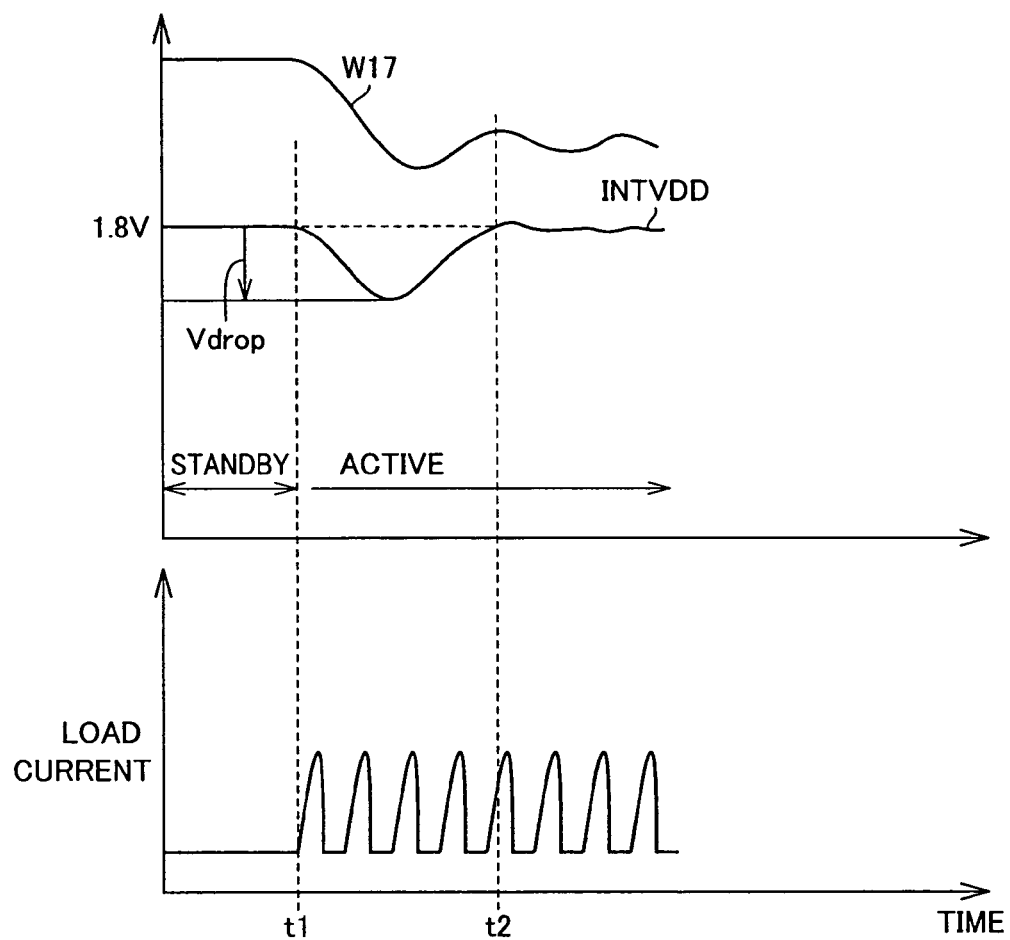
FIG. 24 illustrates a problematic voltage drop caused by a reduced bias current.

The transistors for low voltage have a lower threshold voltage Vthn. Therefore, provided that bias potential VGBR is the same, an absolute value of "Vgs–Vthn" is greater in the transistors for low voltage than that in the transistors for high voltage. As a result, the transistors for low voltage are relatively less affected by variation in threshold voltage Vthn. Moreover, since variation in threshold voltage Vthn is reduced, variation in "Vgs–Vthn" can further be reduced. In other words, replacing N-channel MOS transistor N3 in the conventional voltage down-converter 524 of FIG. 23 with a transistor for low voltage enables variation in bias current Ibias to be reduced as compared to the conventional circuit.

Seventh Embodiment

Figure 21:
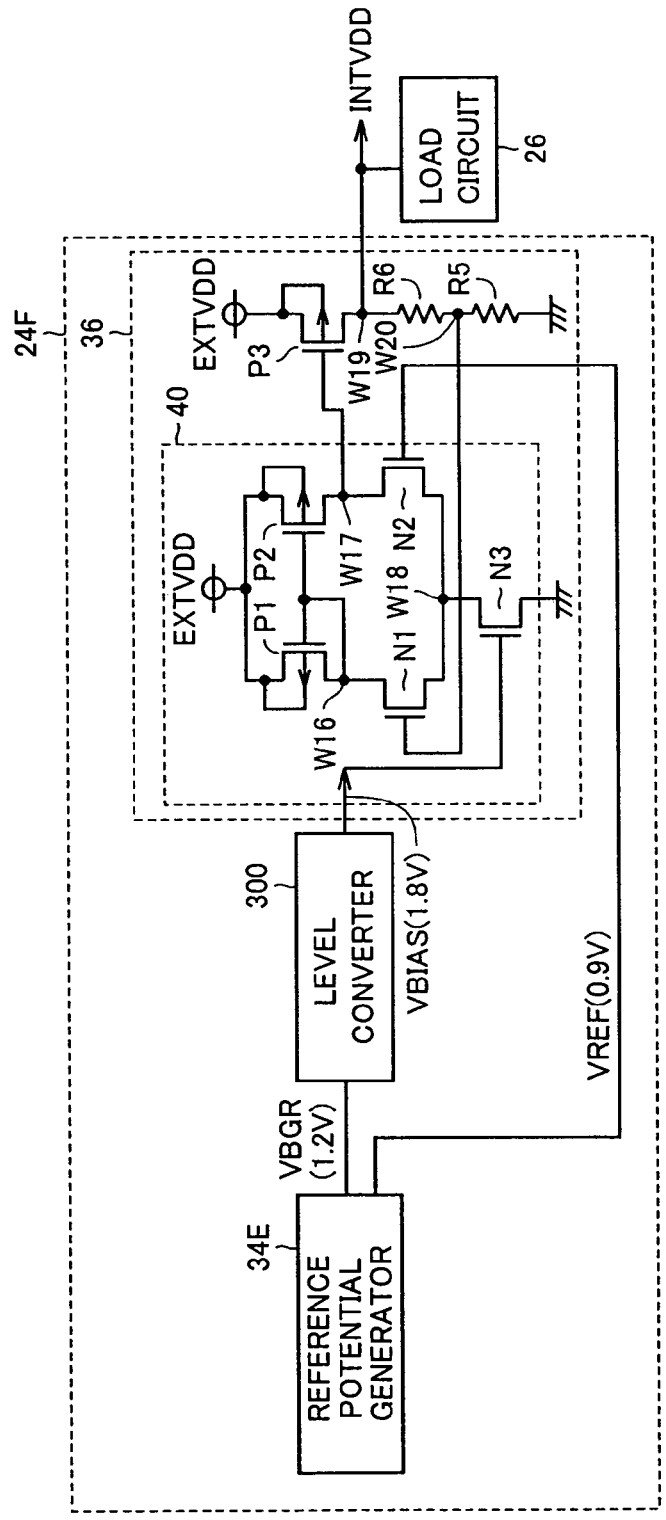
FIG. 21 is a circuit diagram showing the structure of a voltage down-converter 24F according to a seventh embodiment of the present invention.

FIG. 21 is a circuit diagram showing the structure of a voltage down-converter 24F according to the seventh embodiment of the present invention.

Referring to FIG. 21, voltage down-converter 24F includes a reference potential generator 34E, a level converter 300 and a down-converting portion 36. Reference potential generator 34E outputs a reference potential VREF (e.g., 0.9 V) and a bias potential VBGR (e.g., 1.2 V). Level converter 300 converts the level of bias potential VBGR and outputs a bias potential VBIAS (e.g., 1.8 V). Down-converting portion 36 down-converts a power supply potential EXTVDD according to bias potential VBIAS and reference potential VREF and outputs a power supply potential INTVDD.

Since the structure of reference potential generator 34E is described above in connection with FIG. 20, description thereof will not be repeated. Moreover, since the structure of down-converting portion 36 is described above in connection with FIG. 2, description thereof will not be repeated.

Figure 22:
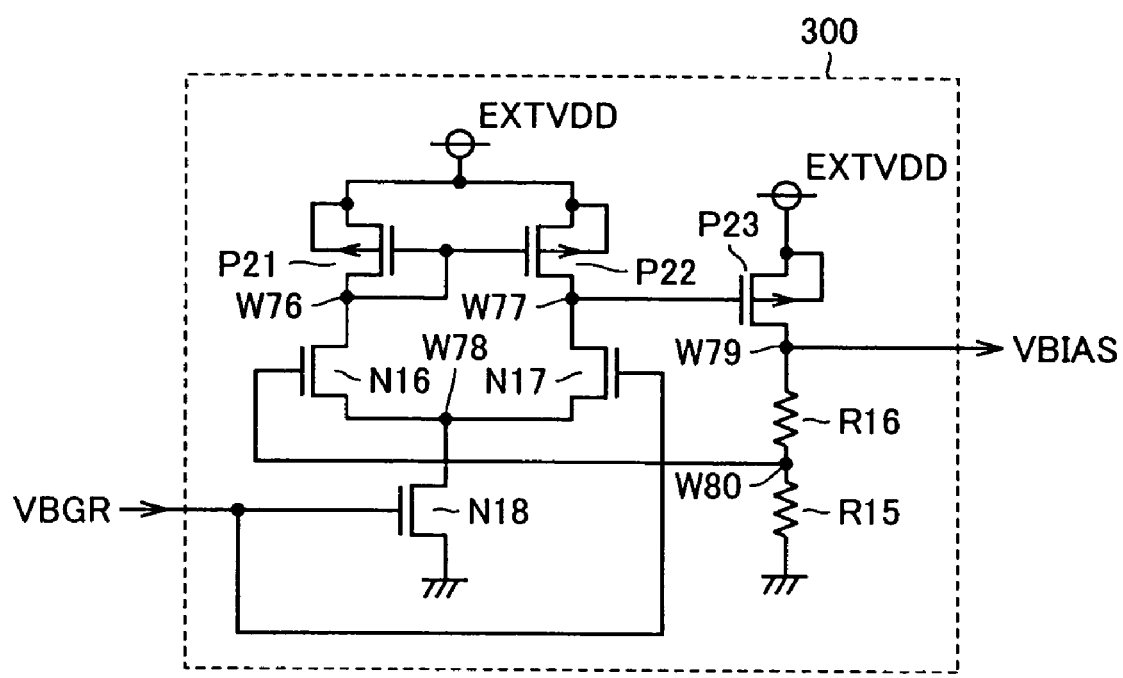
FIG. 22 is a circuit diagram showing the structure of a level converter 300 in FIG. 21.

FIG. 22 is a circuit diagram showing the structure of level converter 300 in FIG. 21.

Referring to FIG. 22, level converter 300 includes a P-channel MOS transistor P21, an N-channel MOS transistor N16, a P-channel MOS transistor P22, an N-channel MOS transistor N17 and an N-channel MOS transistor N18. P-channel MOS transistor P21 has its source and back gate coupled to an external power supply potential EXTVDD, and its gate aid drain connected to a node W76. N-channel MOS transistor N16 is connected between nodes W76, W78, and has its gate connected to a node W80. P-channel MOS transistor P22 has its source and back gate coupled to power supply potential EXTVDD, its gate connected to node W76 and its drain connected to a node W77. N-channel MOS transistor N17 is connected between nodes W77, W78 and receives bias potential VBGR at its gate. N-channel MOS transistor N18 is connected between node W78 and ground node and receives bias potential VBGR at its gate.

Level converter 300 further includes a P-channel MOS transistor P23 and resistors R16, R15. P-channel MOS transistor P23 has its source and back gate coupled to power supply potential EXTVDD, its gate connected to node W77 and its drain connected to a node W79. Resistor R16 is connected between nodes W79, W80 and resistor R15 is connected between node W80 and ground node. Bias potential VBIAS is output from node W79.

Based on the same principle as that of the sixth embodiment, the seventh embodiment is intended to increase an absolute value of "Vgs–Vthn" by boosting a bias potential VBIAS to about 1.8 V by level converter 300 and thus increasing a gate potential VG.

Bias potential VBIAS output from level converter 300 need only drive the gate of transistor N3. Accordingly, no load current will flow to the outside. Transistors P21, P22, P23, N16, N11, N18 are intentionally designed to have a small size so as to minimize current consumption.

$$VBIAS = \frac{R15 + R16}{R15} VBGR$$

Therefore, $$1.8\ V = \left(1 + \frac{R16}{R15}\right) \times 1.2\ V$$

$$1 + \frac{R16}{R15} = \frac{3}{2}$$

$$\therefore \frac{R16}{R15} = \frac{1}{2}$$

The resistance ratio is determined so that R15:R16=2:1.

Boosting the bias potential by level conversion and applying it to transistor N3 enables variation in bias current Ibias to be reduced without causing excessive current consumption.

In the first to seventh embodiments, the present invention is applied to a differential amplifier having a bias current that is not dependent on the threshold voltage. However, the present invention is not limited to this. A differential amplifier is a circuit used in various semiconductor devices (e.g., sense amplifier and comparator), and the present invention is useful for such devices.

Although the present invention has been described and illustrated in detail; it is clearly understood that the same is by way of illustration and example only and is not to be taken by way of limitation, the sprit and scope of the present invention being limited only by the terms of the appended claims.

What is claimed is:

1. A semiconductor device, comprising:
   a differential amplifier for amplifying a difference between a first input potential and a second input potential, wherein
   said differential amplifier includes
   a first MOS transistor receiving a control potential at its gate, for determining a bias current of said differential amplifier according to said control potential, and
   second and third MOS transistors having a threshold voltage higher than that of said first MOS transistor and forming a pair for differential amplification;
   a load circuit; and
   a fourth MOS transistor connected between an externally applied first power supply potential node and said load circuit and having its gate potential controlled according to an output of said differential amplifier, for supplying a second power supply potential resulting from down-converting said first power supply potential to said load circuit, wherein
   said first input potential is a reference potential, and
   said second input potential is a function of said second power supply potential, wherein
   said load circuit includes a fifth MOS transistor having a gate oxide film thinner than gate oxide films of said second and third MOS transistors, and
   said first MOS transistor has a gate oxide film thinner than the gate oxide films of said second and third MOS transistors.

2. The semiconductor device according to claim 1, wherein
   said first, second, third and fifth MOS transistors are of a first conductivity type,
   said second and third MOS transistors have their respective sources connected to a drain of said first MOS transistor,
   said first MOS transistor has its source coupled to a ground potential, and
   said differential amplifier further includes sixth and seventh MOS transistors of a second conductivity type having their respective drains connected to drains of said second and third MOS transistors, respectively, and forming a current mirror pair.

3. The semiconductor device according to claim 1, further comprising
   a voltage dividing portion for dividing said second power supply potential and outputting said function of said second power supply potential.

4. The semiconductor device according to claim 1, wherein
   said load circuit includes a memory array having memory cells arranged in a matrix.

* * * * *